United States Patent
Jang et al.

(10) Patent No.: US 11,329,032 B2
(45) Date of Patent: May 10, 2022

(54) SEMICONDUCTOR DEVICE

(71) Applicant: Samsung Electronics Co., Ltd., Suwon-si (KR)

(72) Inventors: Ae-Nee Jang, Seoul (KR); Inhyo Hwang, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/018,324

(22) Filed: Sep. 11, 2020

(65) Prior Publication Data

US 2021/0233897 A1    Jul. 29, 2021

(30) Foreign Application Priority Data

Jan. 23, 2020  (KR) ................. 10-2020-0009017

(51) Int. Cl.
*H01L 25/10* (2006.01)
*H01L 23/31* (2006.01)
(Continued)

(52) U.S. Cl.
CPC ........ *H01L 25/105* (2013.01); *H01L 21/4853* (2013.01); *H01L 21/565* (2013.01); *H01L 21/568* (2013.01); *H01L 21/6835* (2013.01); *H01L 21/78* (2013.01); *H01L 23/3121* (2013.01); *H01L 23/5386* (2013.01); *H01L 23/5389* (2013.01); *H01L 24/19* (2013.01); *H01L 24/20* (2013.01); *H01L 25/50* (2013.01); *H01L 2221/68372* (2013.01);
(Continued)

(58) Field of Classification Search
CPC . H01L 25/105; H01L 21/4853; H01L 21/565; H01L 21/568; H01L 21/6835; H01L 21/78; H01L 23/3121; H01L 23/5386; H01L 23/5389; H01L 24/19; H01L 24/20; H01L 25/50; H01L 2221/68372; H01L 2224/214; H01L 2225/1035; H01L 2225/1041; H01L 2225/1058
See application file for complete search history.

(56) References Cited

U.S. PATENT DOCUMENTS 7,078,541 B2    7/2006  Boddupalli et al.
8,546,946 B2 *  10/2013 Nin .................. H01L 25/0657
                                                 257/758
(Continued)

*Primary Examiner* — Fernando L Toledo
*Assistant Examiner* — Neil R Prasad
(74) *Attorney, Agent, or Firm* — Harness, Dickey & Pierce, P.L.C.

(57) ABSTRACT

A semiconductor device includes a first package, and a second package stacked on the first package. Each of the first and second packages includes a first redistribution substrate having a first redistribution pattern, a first semiconductor chip on the first redistribution substrate and connected to the first redistribution pattern, a first molding layer covering the first semiconductor chip on the first redistribution substrate, a first through-electrode penetrating the first molding layer so as to be connected to the first redistribution pattern, and a second through-electrode penetrating the first molding layer and not connected to the first redistribution pattern. The first redistribution pattern of the second package is electrically connected to the second through-electrode of the first package.

20 Claims, 19 Drawing Sheets

(51) Int. Cl.
*H01L 23/538* (2006.01)
*H01L 21/683* (2006.01)
*H01L 21/48* (2006.01)
*H01L 21/56* (2006.01)
*H01L 21/78* (2006.01)
*H01L 23/00* (2006.01)
*H01L 25/00* (2006.01)

(52) U.S. Cl.
CPC .................. *H01L 2224/214* (2013.01); *H01L 2225/1035* (2013.01); *H01L 2225/1041* (2013.01); *H01L 2225/1058* (2013.01)

(56) References Cited

U.S. PATENT DOCUMENTS

| | | |
|---|---|---|
| 8,816,490 B2 | 8/2014 | Foster, Sr. et al. |
| 9,108,841 B1 | 8/2015 | Bowles et al. |
| 9,142,502 B2 | 9/2015 | Gong et al. |
| 9,177,892 B2* | 11/2015 | Chi .................. H01L 23/48 |
| 9,379,063 B2 | 6/2016 | Nomoto et al. |
| 9,595,485 B2 | 3/2017 | Vincent et al. |
| 9,761,565 B2 | 9/2017 | Vincent et al. |
| 10,103,124 B2 | 10/2018 | Kawaminami |
| 2011/0309468 A1* | 12/2011 | Oh ................ H01L 25/0657 257/508 |
| 2013/0214855 A1* | 8/2013 | Foster, Sr ............. H01L 21/822 327/544 |
| 2018/0130782 A1 | 5/2018 | Lee |
| 2019/0333894 A1* | 10/2019 | Eom ................ H01L 23/49838 |

* cited by examiner

SEMICONDUCTOR DEVICE

CROSS-REFERENCE TO RELATED APPLICATION

This U.S. non-provisional patent application is based on and claims priority under 35 U.S.C. § 119 to Korean Patent Application No. 10-2020-0009017, filed on Jan. 23, 2020, in the Korean Intellectual Property Office, the disclosure of which is hereby incorporated by reference in its entirety.

BACKGROUND

Some example embodiments of the inventive concepts relate to semiconductor devices and, more particularly, to semiconductor devices including a wafer-level semiconductor package.

With the development of an electronic industry, semiconductor packages have been variously developed to reduce their sizes, weights and/or manufacturing costs. In addition, various kinds of semiconductor packages have been developed to be applied to various fields such as digital imaging devices, MP3 players, mobile phones, and large-capacity storage means. For example, a ball grid array (BGA) package and/or a wafer-level package have been suggested.

In the wafer-level package, a redistribution pattern may be formed on a semiconductor chip without a molding process, and a solder ball may be adhered directly to the redistribution pattern. In other words, the molding process and a printed circuit board may not be required in the wafer-level package. Thus, processes of manufacturing the wafer-level package may be simplified and a thickness of the wafer-level package may be reduced.

SUMMARY

Some example embodiments of the inventive concepts may provide semiconductor devices with improved electrical characteristics and/or method for manufacturing the same.

In an example embodiment of the inventive concepts, a semiconductor device may include a first package, and a second package stacked on the first package. Each of the first and second packages may include a first redistribution substrate having a first redistribution pattern, a first semiconductor chip on the first redistribution substrate and connected to the first redistribution pattern, a first molding layer covering the first semiconductor chip on the first redistribution substrate, a first through-electrode penetrating the first molding layer so as to be connected to the first redistribution pattern, and a second through-electrode penetrating the first molding layer and not connected to the first redistribution pattern. The first redistribution pattern of the second package may be electrically connected to the second through-electrode of the first package.

In an example embodiment of the inventive concepts, a semiconductor device may include semiconductor packages sequentially stacked. Each of the semiconductor packages may include a redistribution substrate having a first redistribution pattern and a second redistribution pattern, the first and second redistribution patterns being insulated from each other, a semiconductor chip on the redistribution substrate, a first molding layer surrounding the semiconductor chip, and through-electrodes penetrating the first molding layer. The through-electrodes may include a first through-electrode on a first sidewall of the semiconductor chip and connected to the first redistribution pattern, and a second through-electrode spaced apart from the first through-electrode and connected to the second redistribution pattern. The first through-electrode of one semiconductor package of the semiconductor packages may be vertically aligned with the second through-electrode of another semiconductor package of the semiconductor packages thereunder.

In an example embodiment of the inventive concepts, a semiconductor device may include a first package and a second package stacked on the first package. The first package may include a first semiconductor chip, a first molding layer surrounding the first semiconductor chip, a first through-electrode penetrating the first molding layer and connected to the first semiconductor chip through a first redistribution pattern, and a second through-electrode penetrating the first molding layer and not connected to the first redistribution pattern. The second package may include a second semiconductor chip, a second molding layer surrounding the second semiconductor chip, a third through-electrode penetrating the second molding layer and connected to the second semiconductor chip through a second redistribution pattern, and a fourth through-electrode penetrating the second molding layer and not connected to the second redistribution pattern. The third through-electrode of the second package may be connected to the second through-electrode of the first package.

BRIEF DESCRIPTION OF THE DRAWINGS

The inventive concepts will become more apparent in view of the attached drawings and accompanying detailed description.

DETAILED DESCRIPTION

Semiconductor devices according to some example embodiments of the inventive concepts will be described hereinafter with reference to the accompanying drawings.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
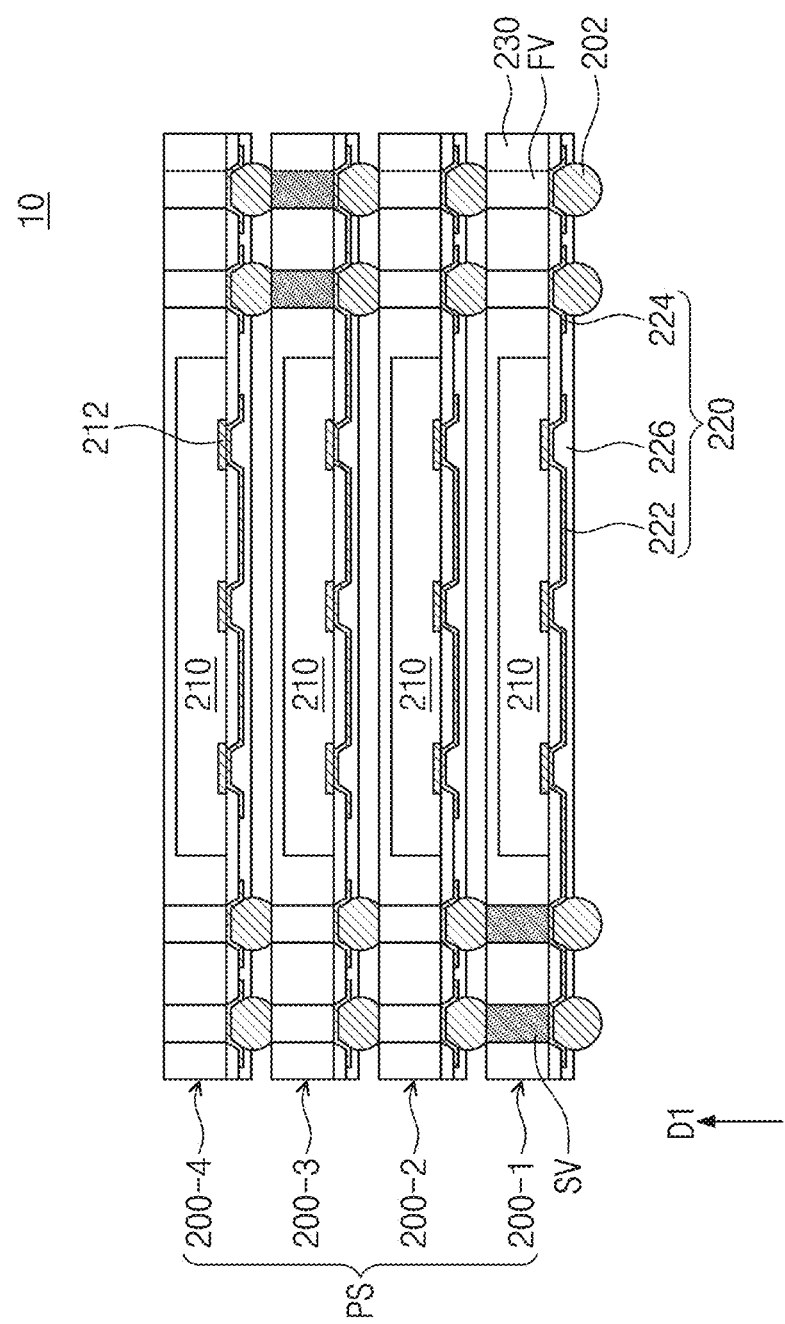
FIG. 1 is a cross-sectional view illustrating a semiconductor device according to an example embodiment of the inventive concepts.
Figure 2:
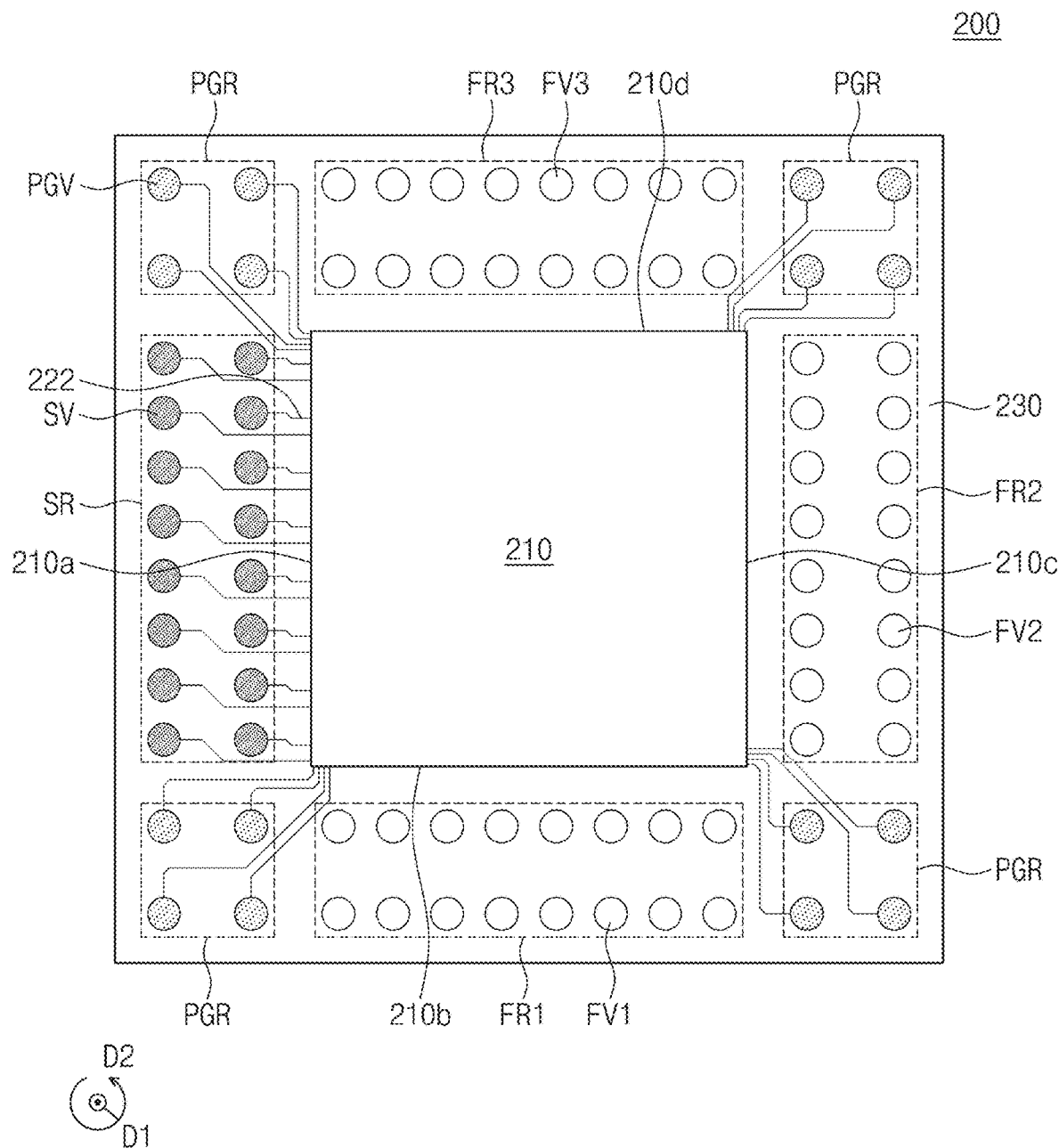
FIG. 2 is a schematic plan view illustrating arrangement of through-electrodes of semiconductor packages.
Figure 3:
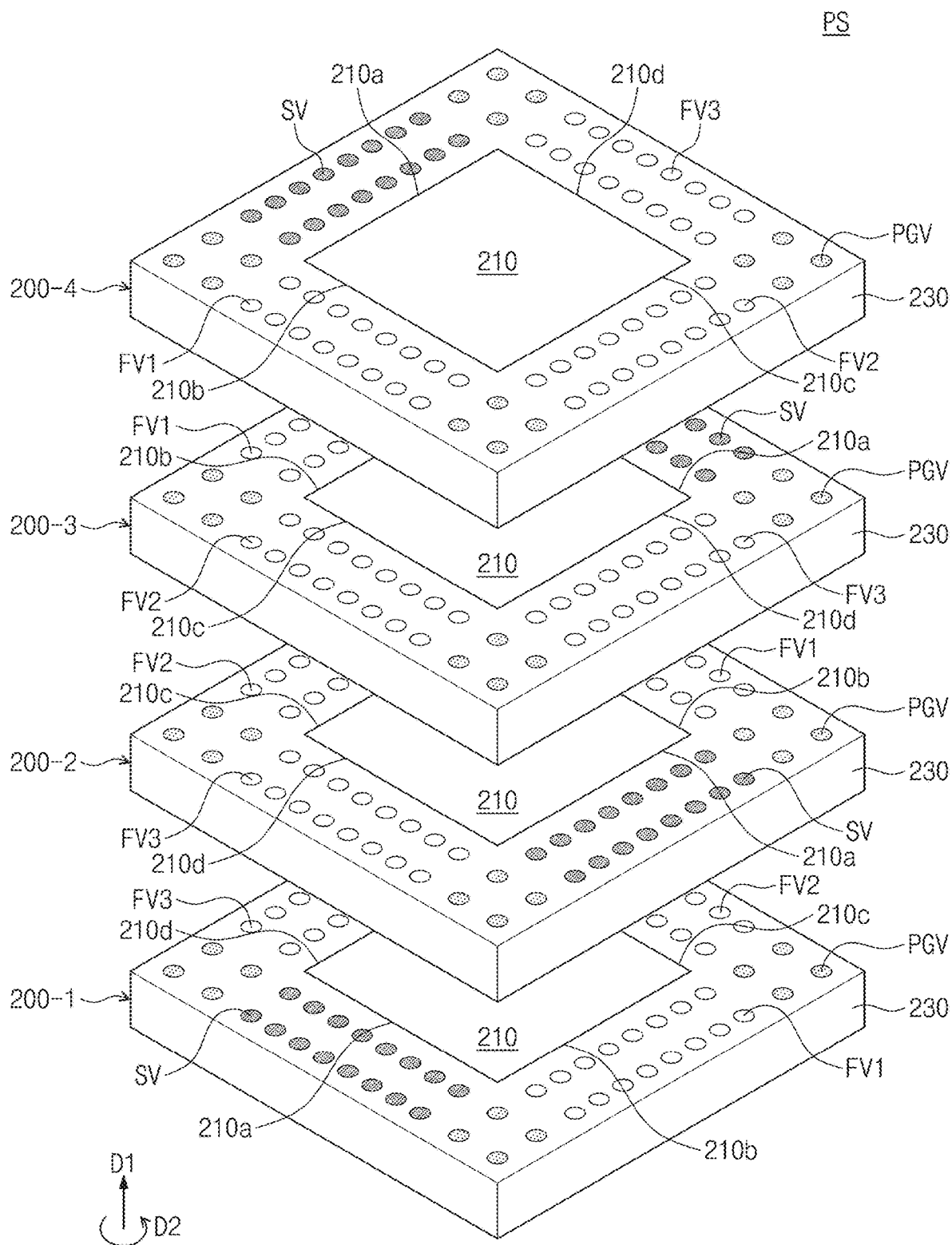
FIG. 3 is a schematic exploded perspective view illustrating configurations of semiconductor packages.

FIG. 1 is a cross-sectional view illustrating a semiconductor device according to an example embodiment of the inventive concepts. FIG. 2 is a schematic plan view illustrating arrangement of through-electrodes of semiconductor packages. FIG. 3 is a schematic exploded perspective view illustrating configurations of semiconductor packages.

Referring to FIG. 1, a semiconductor device 10 may include a package stack PS.

The package stack PS may include first semiconductor packages 200 stacked in a first direction D1. The first semiconductor packages 200 may have the same or substantially similar components and shape. Hereinafter, the components of the first semiconductor packages 200 will be described in detail.

Referring to FIGS. 1 and 2, each of the first semiconductor packages 200 may include a first redistribution substrate 220, a first semiconductor chip 210, a first molding layer 230, and through-electrodes SV, FV and PGV.

The first redistribution substrate 220 may include a plurality of redistribution patterns. The redistribution patterns may include a first redistribution pattern 222, a second redistribution pattern 224, and a first insulating pattern 226. The first insulating pattern 226 may include stacked insulating layers. The number of the stacked insulating layers is 2 in FIG. 1. However, the number of the stacked insulating layers may be variously changed. The first redistribution pattern 222 and the second redistribution pattern 224 may be buried by the stacked insulating layers. The first redistribution pattern 222 and the second redistribution pattern 224 may be electrically insulated from each other. Here, the first redistribution pattern 222 may include a signal transmission pattern connected to the first semiconductor chip 210, and the second redistribution pattern 224 may include floating patterns electrically isolated from the first semiconductor chip 210. A portion of the first redistribution pattern 222 and a portion of the second redistribution pattern 224 may be exposed through a bottom surface of the first insulating pattern 226, and the exposed portions of the first and second redistribution patterns 222 and 224 may function as conductive pads. For example, first connection terminals 202 may be provided on the exposed portions of the first and second redistribution patterns 222 and 224. The first connection terminals 202 may be connected to the first and second redistribution patterns 222 and 224.

The first semiconductor chip 210 may be mounted on the first redistribution substrate 220. The first semiconductor chip 210 may include a semiconductor substrate, integrated circuits on the semiconductor substrate, interconnection lines connected to the integrated circuits, and first chip pads 212 connected to the interconnection lines. The integrated circuits of the first semiconductor chip 210 may include transistors. The first chip pads 212 may be provided on a bottom surface of the first semiconductor chip 210. The first chip pads 212 may include metal (e.g., copper (Cu) or aluminum (Al)). The first chip pads 212 may be electrically connected to the integrated circuits of the first semiconductor chip 210 through the interconnection lines. In the present specification, it will be understood that when a component is referred to as being "electrically connected" to another component, it may be connected directly to the other component or intervening components may be present. The first semiconductor chip 210 may have a polygonal shape when viewed in a plan view. In FIGS. 1 to 3, the first semiconductor chip 210 having a square shape in a plan view is illustrated as an example. The first semiconductor chip 210 may include first to fourth sidewalls 210a, 210b, 210c and 210d. The first to fourth sidewalls 210a, 210b, 210c and 210d may be sequentially arranged in a second direction D2 corresponding to a counter-clockwise direction around the first direction D1. The first to fourth sidewalls 210a, 210b, 210c and 210d may be disposed adjacent to each other. The first to fourth sidewalls 210a, 210b, 210c and 210d of the first semiconductor chip 210 may have the same width. The first semiconductor chip 210 may have a thickness of 20 μm to 40 μm.

The first semiconductor chip 210 may be disposed on the first redistribution substrate 220 in such a way that the first chip pads 212 of the first semiconductor chip 210 face the first redistribution substrate 220. The first chip pads 212 may be connected to the first redistribution pattern 222 of the first redistribution substrate 220. The first chip pads 212 may not be connected to the second redistribution pattern 224. In other words, the first semiconductor chip 210 may be electrically insulated from the second redistribution pattern 224 of the first redistribution substrate 220. In FIG. 1, the first chip pads 212 of the first semiconductor chip 210 are connected directly to the first redistribution pattern 222 of the first redistribution substrate 220. However, embodiments of the inventive concepts are not limited thereto. Unlike FIG. 1, the first semiconductor chip 210 may be mounted on the first redistribution substrate 220 through chip terminals. For example, the chip terminals may be formed between the first redistribution pattern 222 and the first chip pads 212 to electrically connect the first chip pads 212 to the first redistribution pattern 222. In other words, the first semiconductor chip 210 may be electrically connected to the first redistribution substrate 220 through the chip terminals. Each of the chip terminals may include at least one of a solder, a pillar, or a bump. The chip terminals may include a conductive material (e.g., metal).

The first molding layer 230 may be provided on the first redistribution substrate 220. The first molding layer 230 may cover the first redistribution substrate 220. The first semiconductor chip 210 may be buried in the first molding layer 230. For example, the first molding layer 230 may cover the sidewalls of the first semiconductor chip 210 and a top surface of the first semiconductor chip 210. Unlike FIG. 1, the first molding layer 230 may expose the top surface of the first semiconductor chip 210. In other words, the first molding layer 230 may surround the first semiconductor chip 210 on the first redistribution substrate 220. For example, the first molding layer 230 may cover the sidewalls of the first semiconductor chip 210 but may expose the top surface of the first semiconductor chip 210. When the first semiconductor chip 210 is mounted on the first redistribution substrate 220 through the chip terminals, the first molding layer 230 may extend into a gap region between the first semiconductor chip 210 and the first redistribution substrate 220 to seal the chip terminals. The first molding layer 230 may include an insulating polymer (e.g., an epoxy molding compound (EMC)).

The through-electrodes SV, FV and PGV may be provided in the first molding layer 230 on the first redistribution substrate 220. The through-electrodes SV, FV and PGV may be laterally spaced apart from the first semiconductor chip 210. The through-electrodes SV, FV and PGV may penetrate the first molding layer 230 in the first direction D1. Each of the through-electrodes SV, FV and PGV may be connected to one of the first redistribution pattern 222 and the second redistribution pattern 224 of the first redistribution substrate 220. Each of the through-electrodes SV, FV and PGV may be electrically connected to the first connection terminal 202 or the first semiconductor chip 210 through one of the first and second redistribution patterns 222 and 224. The through-electrodes SV, FV and PGV may be exposed at a top surface of the first molding layer 230. The through-electrodes SV, FV and PGV may include a conductive material (e.g., metal).

Referring to FIGS. 1 and 2, the through-electrodes SV, FV and PGV may include first through-electrodes SV, second through-electrodes FV, and third through-electrodes PGV. The first through-electrodes SV may be signal through-electrodes. Here, the signal through-electrode may mean a through-electrode which is used to transmit/receive an electrical signal to/from the first semiconductor chip 210 in the first semiconductor package 200. The second through-electrodes FV may be floating through-electrodes. Here, the floating through-electrode may mean a through-electrode which is electrically isolated from the first semiconductor chip 210 in the first semiconductor package 200. The third through-electrodes PGV may be power/ground through-electrodes. Here, the power/ground through-electrode may mean a through-electrode for supplying a ground voltage or a power voltage to the first semiconductor chip 210.

The first through-electrodes SV may be provided in a signal region SR located on the first sidewall 210a of the first semiconductor chip 210. The first through-electrodes SV may be arranged to constitute rows and columns which are parallel to the top surface of the first redistribution substrate 220. Unlike FIG. 2, the first through-electrodes SV may be arranged in a zigzag form. The first through-electrodes SV may be connected to the first redistribution pattern 222 and may be connected to the first semiconductor chip 210 through the first redistribution pattern 222.

The second through-electrodes FV may be provided in floating regions FR1, FR2 and FR3 located on the second sidewall 210b, the third sidewall 210c and the fourth sidewall 210d of the first semiconductor chip 210. In some example embodiments, the second through-electrodes FV may include first sub-through-electrodes FV1, second sub-through-electrodes FV2, and third sub-through-electrodes FV3. The first sub-through-electrodes FV1 may be provided in a first floating region FR1 located on the second sidewall 210b of the first semiconductor chip 210. The second sub-through-electrodes FV2 may be provided in a second floating region FR2 located on the third sidewall 210c of the first semiconductor chip 210. The third sub-through-electrodes FV3 may be provided in a third floating region FR3 located on the fourth sidewall 210d of the first semiconductor chip 210. The first sub-through-electrodes FV1 may be arranged to constitute rows and columns which are parallel to the top surface of the first redistribution substrate 220. The second sub-through-electrodes FV2 may be arranged to constitute rows and columns which are parallel to the top surface of the first redistribution substrate 220. The third sub-through-electrodes FV3 may be arranged to constitute rows and columns which are parallel to the top surface of the first redistribution substrate 220. Unlike FIG. 2, the first sub-through-electrodes FV1 may be arranged in a zigzag form, the second sub-through-electrodes FV2 may be arranged in a zigzag form, and the third sub-through-electrodes FV3 may be arranged in a zigzag form. The first to third sub-through-electrodes FV1, FV2 and FV3 may be connected to the second redistribution pattern 224 and may be electrically insulated from the first semiconductor chip 210. Here, the first to third sub-through-electrodes FV1, FV2 and FV3 may be respectively connected to the floating patterns electrically isolated from each other in the second redistribution pattern 224. In other words, the first to third sub-through-electrodes FV1, FV2 and FV3 may be electrically insulated from each other.

The third through-electrodes PGV may be provided in a power/ground region PGR. The power/ground region PGR may be spaced apart from the signal region SR and the floating regions FR1, FR2 and FR3. For example, the power/ground region PGR may be disposed adjacent to each of corners of the first semiconductor chip 210. Here, each of the corners of the first semiconductor chip 210 may mean a portion at which two of the sidewalls 210a, 210b, 210c and 210d of the first semiconductor chip 210 are in contact with (e.g., meet) each other. The third through-electrodes PGV may be arranged to constitute rows and columns which are parallel to the top surface of the first redistribution substrate 220. The third through-electrodes PGV may be connected to the first semiconductor chip 210 through a redistribution pattern of the first redistribution substrate 220.

The first semiconductor package 200 may be provided as described above. A thickness of the first semiconductor package 200 including the first redistribution substrate 220, the first semiconductor chip 210 and the first molding layer 230 may range from 30 μm to 50 μm.

Referring to FIGS. 1 to 3, the first semiconductor packages 200 may be stacked. For example, four first semiconductor packages 200 may be stacked. In FIGS. 1 and 3, the four first semiconductor packages 200 are stacked. However, embodiments of the inventive concepts are not limited thereto. In certain example embodiments, two or more first semiconductor packages 200 may be stacked. Hereinafter, the embodiments of FIGS. 1 and 3 in which the four first semiconductor packages 200 are stacked will be mainly described.

The first semiconductor packages 200 may be stacked. Hereinafter, the four first semiconductor packages 200 will be referred to as first to fourth sub-semiconductor packages 200-1, 200-2, 200-3 and 200-4 for the purpose of ease and convenience in explanation. Each of the first to fourth sub-semiconductor packages 200-1, 200-2, 200-3 and 200-4 may be the same as the first semiconductor package 200 described above, and the components of the first to fourth sub-semiconductor packages 200-1, 200-2, 200-3 and 200-4 may be the same as each other.

The second sub-semiconductor package 200-2 may be mounted on the first sub-semiconductor package 200-1. The second sub-semiconductor package 200-2 may be aligned with the first sub-semiconductor package 200-1. For example, the second sub-semiconductor package 200-2 and the first sub-semiconductor package 200-1 may be twist-shifted from each other. In the present specification, it may be understood that when one component is 'twist-shifted' from (or with respect to) another component, the one component may be rotated (or twisted) around one axis with respect to the other component in a state in which the one and other components overlap with each other along the one axis. The second sub-semiconductor package 200-2 may be twist-shifted with respect to the first sub-semiconductor package 200-1 in the second direction D2 corresponding to the counter-clockwise direction rotating around the first direction D1. For example, the first sub-semiconductor package 200-1 and the second sub-semiconductor package 200-2 may overlap with each other in the first direction D1, and the first sidewall 210a of the first semiconductor chip 210 of the second sub-semiconductor package 200-2 may be located in the same plane (e.g., the same vertical plane or a plane in the first direction D1) as the second sidewall 210b of the first semiconductor chip 210 of the first sub-semiconductor package 200-1. In other words, the second sub-semiconductor package 200-2 may be twist-shifted 90 degrees with respect to the first sub-semiconductor package 200-1. Thus, the first through-electrodes SV of the second sub-semiconductor package 200-2 may be aligned with the first sub-through-electrodes FV1 of the first sub-semiconductor package 200-1.

The first sub-through-electrodes FV1, the second sub-through-electrodes FV2 and the third sub-through-electrodes FV3 of the second sub-semiconductor package 200-2 may be aligned with the second sub-through-electrodes FV2, the third sub-through-electrodes FV3 and the first through-electrodes SV of the first sub-semiconductor package 200-1, respectively. The third through-electrodes PGV of the second sub-semiconductor package 200-2 may be aligned with and electrically connected to the third through-electrodes PGV of the first sub-semiconductor package 200-1.

The first connection terminals 202 of the second sub-semiconductor package 200-2 may be connected to the through-electrodes SV, FV1, FV2, FV3 and PGV of the first sub-semiconductor package 200-1. The first semiconductor chip 210 of the second sub-semiconductor package 200-2 may be connected to the first sub-through-electrodes FV1 of the first sub-semiconductor package 200-1 through the first redistribution pattern 222 and the first connection terminals 202 of the second sub-semiconductor package 200-2. The first semiconductor chip 210 of the first sub-semiconductor package 200-1 and the first semiconductor chip 210 of the second sub-semiconductor package 200-2 may be respectively connected to the first redistribution pattern 222 and the second redistribution pattern 224 of the first sub-semiconductor package 200-1 which are electrically insulated from each other, and thus a bandwidth of the semiconductor device 10 may be increased.

The third sub-semiconductor package 200-3 may be mounted on the second sub-semiconductor package 200-2. The third sub-semiconductor package 200-3 may not be aligned with the second sub-semiconductor package 200-2. For example, the third sub-semiconductor package 200-3 and the second sub-semiconductor package 200-2 may be twist-shifted from each other. The third sub-semiconductor package 200-3 may be twist-shifted with respect to the second sub-semiconductor package 200-2 in the second direction D2. For example, the second sub-semiconductor package 200-2 and the third sub-semiconductor package 200-3 may overlap with each other in the first direction D1, and the first sidewall 210a of the first semiconductor chip 210 of the third sub-semiconductor package 200-3 may be located in the same plane (e.g., the same vertical plane or a plane in the first direction D1) as the second sidewall 210b of the first semiconductor chip 210 of the second sub-semiconductor package 200-2. In other words, the third sub-semiconductor package 200-3 may be twist-shifted 90 degrees with respect to the second sub-semiconductor package 200-2. Thus, the first through-electrodes SV of the third sub-semiconductor package 200-3 may be aligned with the first sub-through-electrodes FV1 of the second sub-semiconductor package 200-2.

The first sub-through-electrodes FV1, the second sub-through-electrodes FV2 and the third sub-through-electrodes FV3 of the third sub-semiconductor package 200-3 may be aligned with the second sub-through-electrodes FV2, the third sub-through-electrodes FV3 and the first through-electrodes SV of the second sub-semiconductor package 200-2, respectively. The third through-electrodes PGV of the third sub-semiconductor package 200-3 may be aligned with and electrically connected to the third through-electrodes PGV of the second sub-semiconductor package 200-2.

The first connection terminals 202 of the third sub-semiconductor package 200-3 may be connected to the through-electrodes SV, FV1, FV2, FV3 and PGV of the second sub-semiconductor package 200-2. The first semiconductor chip 210 of the third sub-semiconductor package 200-3 may be connected to the second sub-through-electrodes FV2 of the first sub-semiconductor package 200-1 through the first redistribution pattern 222 and the first connection terminals 202 of the third sub-semiconductor package 200-3 and the first sub-through-electrodes FV1 of the second sub-semiconductor package 200-2. The first semiconductor chip 210 of the first sub-semiconductor package 200-1, the first semiconductor chip 210 of the second sub-semiconductor package 200-2 and the first semiconductor chip 210 of the third sub-semiconductor package 200-3 may be respectively connected to the first redistribution pattern 222 and the second redistribution patterns 224 of the first sub-semiconductor package 200-1 which are electrically insulated from each other, and thus the bandwidth of the semiconductor device 10 may be increased.

The fourth sub-semiconductor package 200-4 may be mounted on the third sub-semiconductor package 200-3. The fourth sub-semiconductor package 200-4 may not be aligned with the third sub-semiconductor package 200-3. For example, the fourth sub-semiconductor package 200-4 and the third sub-semiconductor package 200-3 may be twist-shifted from each other. The fourth sub-semiconductor package 200-4 may be twist-shifted with respect to the third sub-semiconductor package 200-3 in the second direction D2. For example, the third sub-semiconductor package 200-3 and the fourth sub-semiconductor package 200-4 may overlap with each other in the first direction D1, and the first sidewall 210a of the first semiconductor chip 210 of the fourth sub-semiconductor package 200-4 may be located in the same plane (e.g., the same vertical plane or a plane in the first direction D1) as the second sidewall 210b of the first semiconductor chip 210 of the third sub-semiconductor package 200-3. In other words, the fourth sub-semiconductor package 200-4 may be twist-shifted 90 degrees with respect to the third sub-semiconductor package 200-3. Thus, the first through-electrodes SV of the fourth sub-semiconductor package 200-4 may be aligned with the first sub-through-electrodes FV1 of the third sub-semiconductor package 200-3.

The first sub-through-electrodes FV1, the second sub-through-electrodes FV2 and the third sub-through-electrodes FV3 of the fourth sub-semiconductor package 200-4 may be aligned with the second sub-through-electrodes FV2, the third sub-through-electrodes FV3 and the first through-electrodes SV of the third sub-semiconductor package 200-3, respectively. The third through-electrodes PGV of the fourth sub-semiconductor package 200-4 may be aligned with and electrically connected to the third through-electrodes PGV of the third sub-semiconductor package 200-3.

The first connection terminals 202 of the fourth sub-semiconductor package 200-4 may be connected to the through-electrodes SV, FV1, FV2, FV3 and PGV of the third sub-semiconductor package 200-3. The first semiconductor chip 210 of the fourth sub-semiconductor package 200-4 may be connected to the third sub-through-electrodes FV3 of the first sub-semiconductor package 200-1 through the first redistribution pattern 222 and the first connection terminals 202 of the fourth sub-semiconductor package 200-4, the first sub-through-electrodes FV1 of the third sub-semiconductor package 200-3, and the second sub-through-electrodes FV2 of the second sub-semiconductor package 200-2. The first semiconductor chip 210 of the first sub-semiconductor package 200-1, the first semiconductor chip 210 of the second sub-semiconductor package 200-2, the first semiconductor chip 210 of the third sub-semiconductor package 200-3 and the first semiconductor chip 210 of the fourth sub-semiconductor package 200-4 may be respectively connected to the first redistribution pattern 222 and the second redistribution patterns 224 of the first sub-semiconductor package 200-1 which are electrically insulated from each other, and thus the bandwidth of the semiconductor device 10 may be increased. The package stack PS may be provided as described above.

Figure 4:
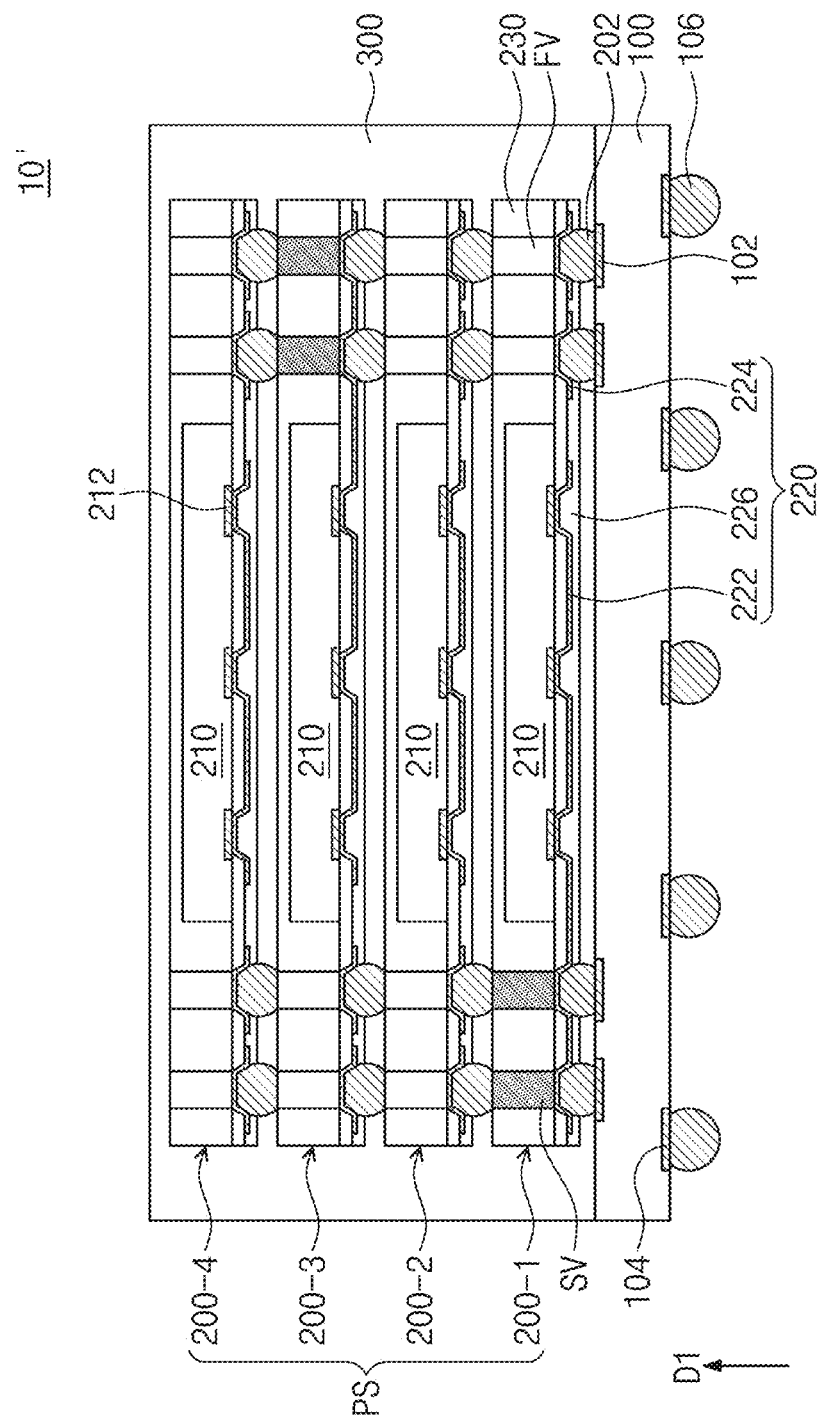
FIGS. 4 and 5 are cross-sectional views illustrating semiconductor devices according to an example embodiment of the inventive concepts.

In certain example embodiments, a semiconductor device 10' may further include a package substrate 100 and a package molding layer 300. Referring to FIG. 4, the package substrate 100 may be provided. The package substrate 100 may be a printed circuit board (PCB). The package substrate 100 may have a top surface and a bottom surface. First pads 102 may be provided on the top surface of the package substrate 100, and second pads 104 may be provided on the bottom surface of the package substrate 100. The first pads 102 may be pads on which the package stack PS is mounted. External terminals 106 may be disposed on the second pads 104, respectively. The external terminals 106 may electrically connect the semiconductor device 10' to an external device.

The package stack PS may be mounted on the package substrate 100. For example, the first semiconductor packages 200 may be stacked on the package substrate 100.

The first sub-semiconductor package 200-1 disposed at a lowermost end of the package stack PS may be mounted on the package substrate 100. The first connection terminals 202 of the first sub-semiconductor package 200-1 may be connected to the first pads 102 of the package substrate 100. The first semiconductor chip 210 of the first sub-semiconductor package 200-1 may be connected to the package substrate 100 through the first redistribution pattern 222. The second through-electrodes FV1, FV2 and FV3 of the first sub-semiconductor package 200-1 may be connected to the package substrate 100 through the second redistribution pattern 224. The third through-electrodes PGV of the first sub-semiconductor package 200-1 may be connected to a ground circuit or a power circuit of the package substrate 100.

The package molding layer 300 may be provided on the package substrate 100. The package molding layer 300 may cover the package stack PS on the package substrate 100. The package molding layer 300 may cover sidewalls of the first semiconductor packages 200 and may fill spaces between the first semiconductor packages 200. Thus, the package molding layer 300 may protect the package stack PS. The package molding layer 300 may include an insulating polymer (e.g., an epoxy molding compound (EMC)).

Figure 5:
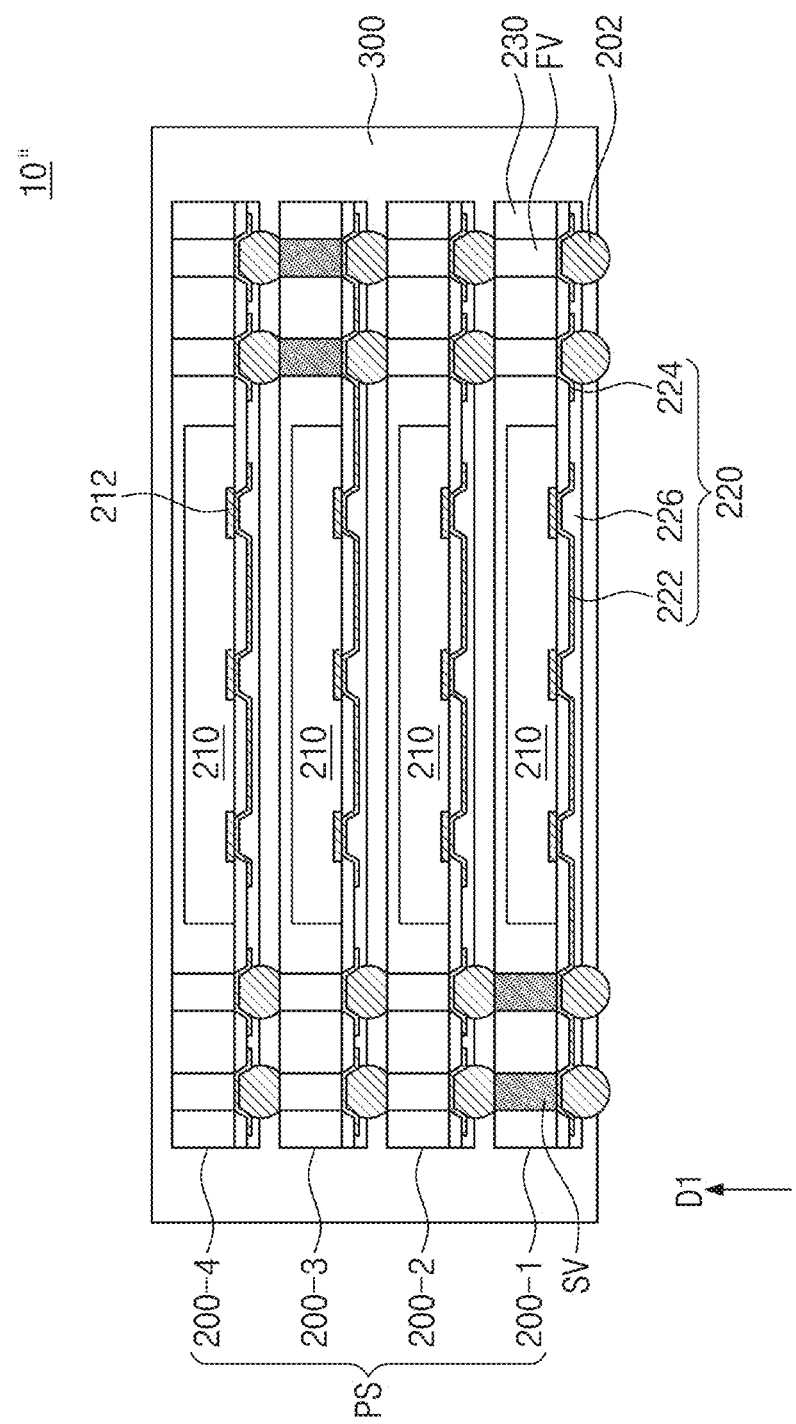

In certain example embodiments, a semiconductor device 10" may not include the package substrate 100. Referring to FIG. 5, the package substrate 100 may not be provided. The first connection terminals 202 of the first sub-semiconductor package 200-1 disposed at the lowermost end of the package stack PS may electrically connect the semiconductor device 10" to an external device.

The package molding layer 300 may be provided. The package molding layer 300 may cover the package stack PS. The package molding layer 300 may cover the sidewalls of the first semiconductor packages 200 and may fill the spaces between the first semiconductor packages 200. Thus, the package molding layer 300 may protect the package stack PS. In addition, the package molding layer 300 may cover the redistribution substrate 220 of the first sub-semiconductor package 200-1. Thus, the package molding layer 300 may protect the redistribution substrate 220 of the first sub-semiconductor package 200-1. The first connection terminals 202 of the first sub-semiconductor package 200-1 may penetrate the package molding layer 300 so as to be exposed to the outside. The package molding layer 300 may include an insulating polymer (e.g., an epoxy molding compound (EMC)).

Figure 6:
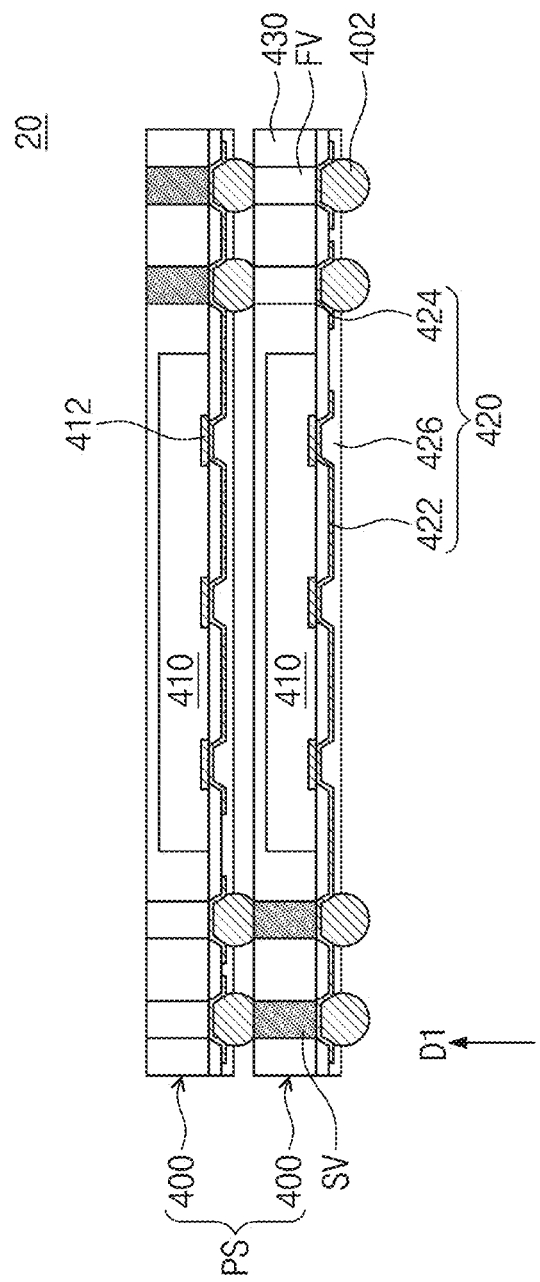
FIG. 6 is a cross-sectional view illustrating a semiconductor device according to an example embodiment of the inventive concepts.
Figure 7:
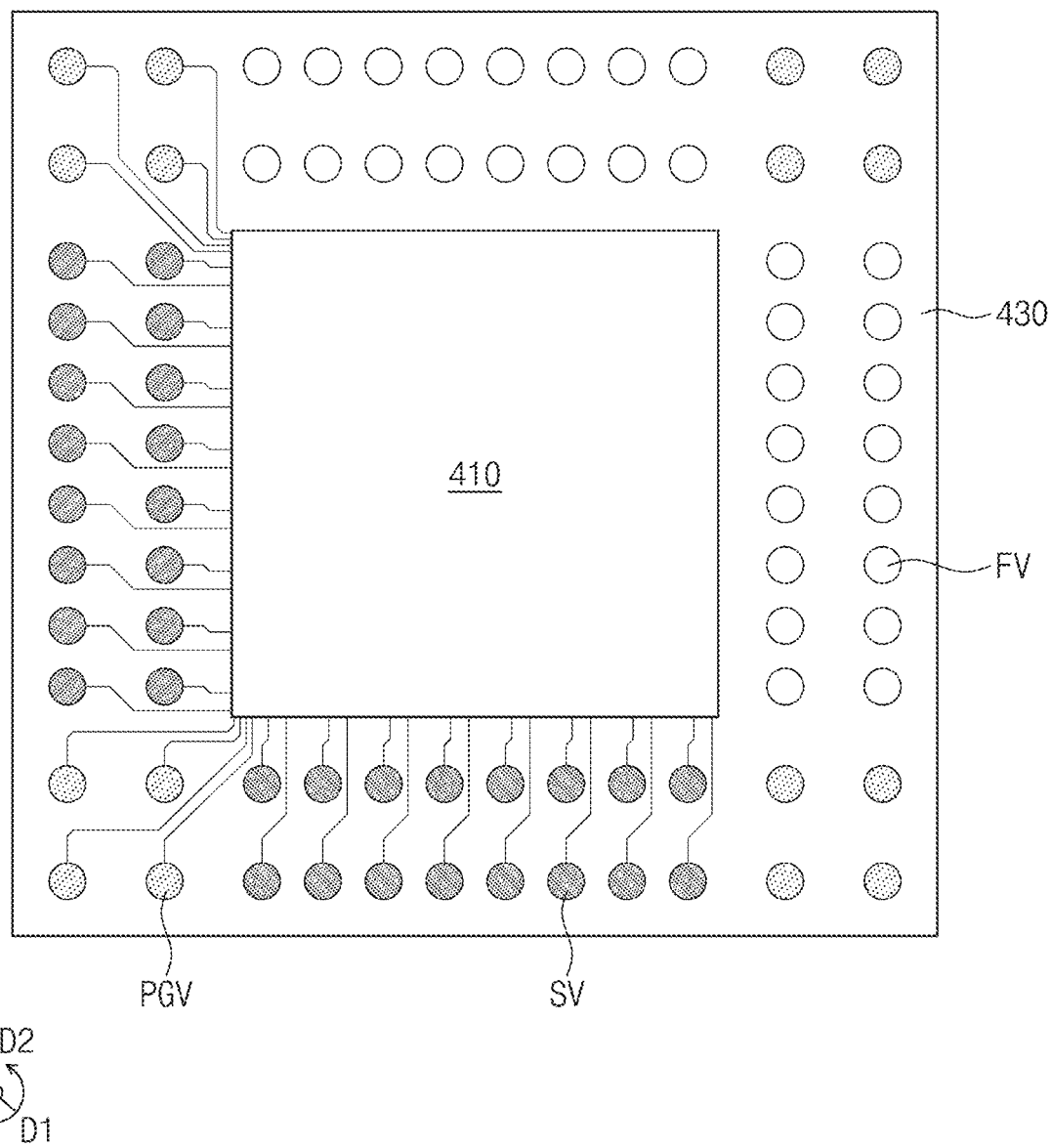
FIG. 7 is a schematic plan view illustrating arrangement of through-electrodes of semiconductor packages.

FIG. 6 is a cross-sectional view illustrating a semiconductor device according to an example embodiment of the inventive concepts. FIG. 7 is a schematic plan view illustrating arrangement of through-electrodes of semiconductor packages.

Referring to FIGS. 6 and 7, a semiconductor device 20 may include a package stack PS.

The package stack PS may include second semiconductor packages 400 stacked in the first direction D1. The second semiconductor packages 400 may be sequentially stacked. For example, two second semiconductor packages 400 may be sequentially stacked. The second semiconductor packages 400 may have the same or substantially similar components and shape.

The second semiconductor package 400 may include a second redistribution substrate 420, a second semiconductor chip 410, a second molding layer 430, and through-electrodes SV, FV and PGV.

The second redistribution substrate 420 may include a plurality of redistribution patterns. The redistribution patterns may include a third redistribution pattern 422, a fourth redistribution pattern 424, and a second insulating pattern 426. The third redistribution pattern 422 and the fourth redistribution pattern 424 may be buried in the second insulating pattern 426. The third redistribution pattern 422 and the fourth redistribution pattern 424 may be electrically insulated from each other. Here, the third redistribution pattern 422 may include a signal transmission pattern connected to the second semiconductor chip 410, and the fourth redistribution pattern 424 may include a floating pattern electrically isolated from the second semiconductor chip 410. A portion of the third redistribution pattern 422 and a portion of the fourth redistribution pattern 424 may be exposed through a bottom surface of the second insulating pattern 426, and second connection terminals 402 may be provided on the exposed portions of the third and fourth redistribution patterns 422 and 424.

The second semiconductor chip 410 may be mounted on the second redistribution substrate 420. The second semiconductor chip 410 may include a semiconductor substrate, integrated circuits on the semiconductor substrate, interconnection lines connected to the integrated circuits, and second chip pads 412 connected to the interconnection lines. The second chip pads 412 may be electrically connected to the integrated circuits of the second semiconductor chip 410 through the interconnection lines. The second semiconductor chip 410 may have a square shape when viewed in a plan view.

The second semiconductor chip 410 may be disposed on the second redistribution substrate 420 in such a way that the second chip pads 412 of the second semiconductor chip 410 face the second redistribution substrate 420. The second chip pads 412 may be connected to the third redistribution pattern 422 of the second redistribution substrate 420. The second chip pads 412 may not be connected to the fourth redistribution pattern 424.

The second molding layer 430 may be provided on the second redistribution substrate 420. The second molding layer 430 may cover the second redistribution substrate 420. The second molding layer 430 may cover the second semiconductor chip 410.

The through-electrodes SV, FV and PGV may be provided in the second molding layer 430 on the second redistribution substrate 420. The through-electrodes SV, FV and PGV may be laterally spaced apart from the second semiconductor chip 410. The through-electrodes SV, FV and PGV may penetrate the second molding layer 430 in the first direction D1. Each of the through-electrodes SV, FV and PGV may be connected to one of the third redistribution pattern 422 and the fourth redistribution pattern 424 of the second redistribution substrate 420. Each of the through-electrodes SV, FV and PGV may be electrically connected to the second connection terminal 402 or the second semiconductor chip 410 through one of the third and fourth redistribution patterns 422 and 424.

The through-electrodes SV, FV and PGV may include first through-electrodes SV, second through-electrodes FV, and third through-electrodes PGV. The first through-electrodes SV may be signal through-electrodes. The second through-electrodes FV may be floating through-electrodes. The third through-electrodes PGV may be power/ground through-electrodes.

The first through-electrodes SV may be provided on two sidewalls of the second semiconductor chip 410. The first through-electrodes SV may be connected to the third redistribution pattern 422 and may be connected to the second semiconductor chip 410 through the third redistribution pattern 422.

The second through-electrodes FV may be provided on two sidewalls of the second semiconductor chip 410. Here, the sidewalls of the second semiconductor chip 410 which are adjacent to the first through-electrodes SV may be different from the sidewalls of the second semiconductor chip 410 which are adjacent to the second through-electrodes FV. The second through-electrodes FV may be connected to the fourth redistribution pattern 424 and may be electrically insulated from the second semiconductor chip 410.

The third through-electrodes PGV may be spaced apart from the first and second through-electrodes SV and FV. For example, the third through-electrodes PGV may be disposed adjacent to a corner of the second semiconductor chip 410. The third through-electrodes PGV may be connected to the second semiconductor chip 410 through a redistribution pattern of the second redistribution substrate 420.

The second semiconductor packages 400 may be stacked. The second semiconductor packages 400 may not be aligned with each other. For example, the second semiconductor packages 400 may be twist-shifted from each other. An upper one of the second semiconductor packages 400 may be twist-shifted with respect to a lower one of the second semiconductor packages 400 in the second direction D2. For example, the second semiconductor packages 400 may overlap with each other in the first direction D1, and the upper one of the second semiconductor packages 400 may be twist-shifted 180 degrees with respect to the lower one of the second semiconductor packages 400. Thus, the first through-electrodes SV of the upper one of the second semiconductor packages 400 may be aligned with the second through-electrodes FV of the lower one of the second semiconductor packages 400.

The second connection terminals 402 of the upper one of the second semiconductor packages 400 may be connected to the through-electrodes SV, FV and PGV of the lower one of the second semiconductor packages 400. The second semiconductor chip 410 of the upper one of the second semiconductor packages 400 may be connected to the second through-electrodes FV of the lower one of the second semiconductor packages 400. The second semiconductor chips 410 of the second semiconductor packages 400 may be respectively connected to the redistribution patterns electrically insulated from each other, and thus a bandwidth of the semiconductor device 20 may be increased.

Figure 8:
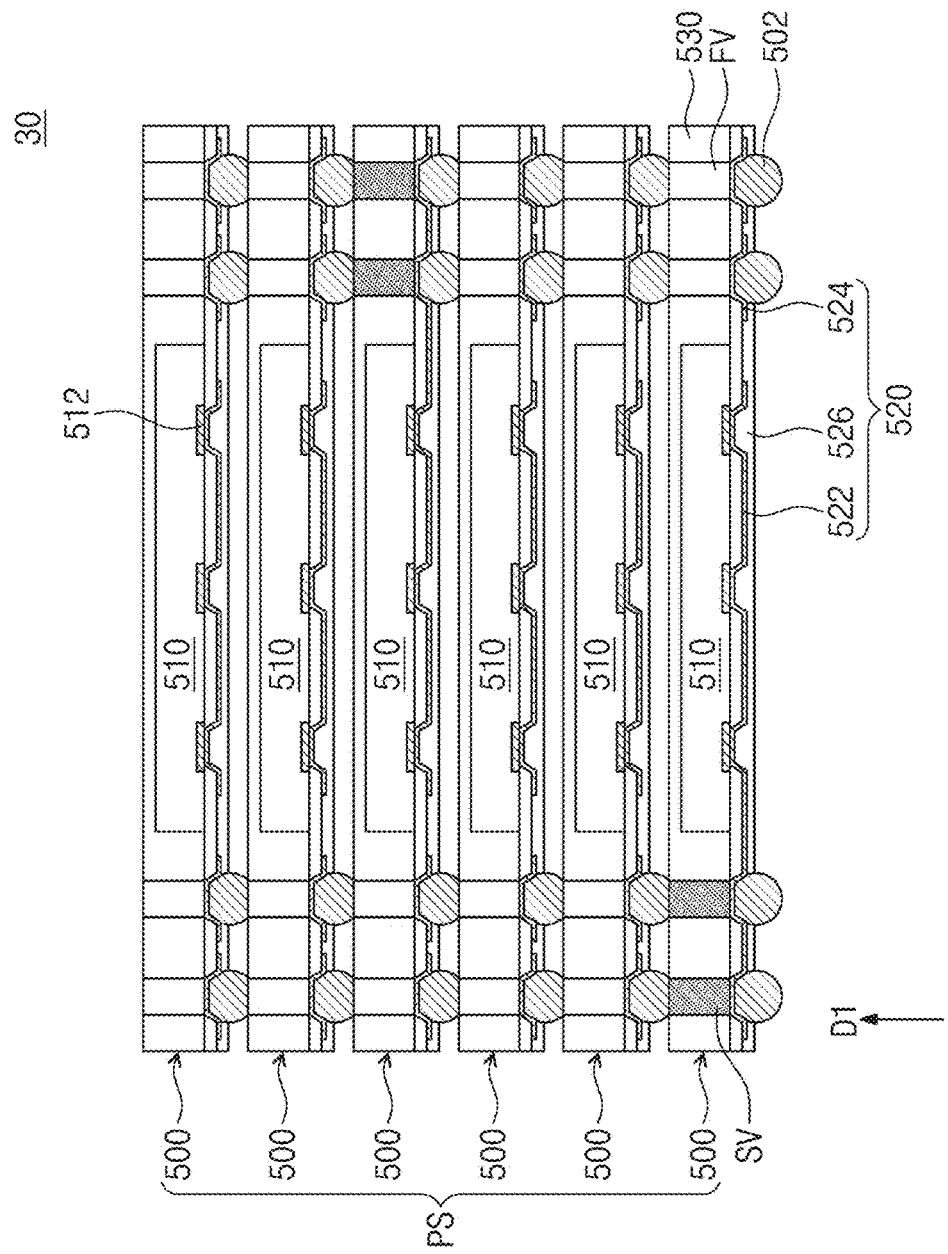
FIG. 8 is a cross-sectional view illustrating a semiconductor device according to an example embodiment of the inventive concepts.
Figure 9:
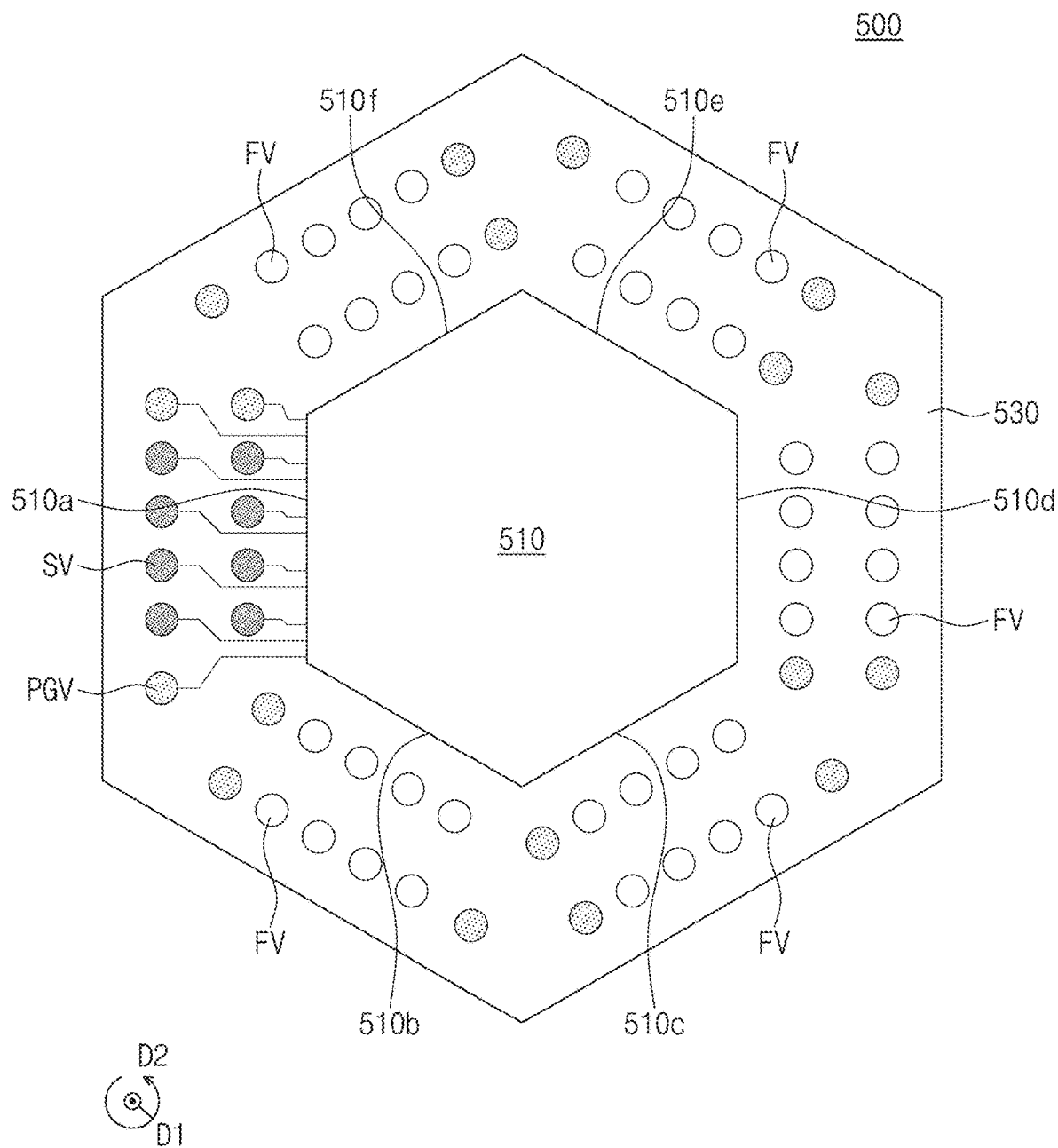
FIG. 9 is a schematic plan view illustrating arrangement of through-electrodes of semiconductor packages.
Figure 10:
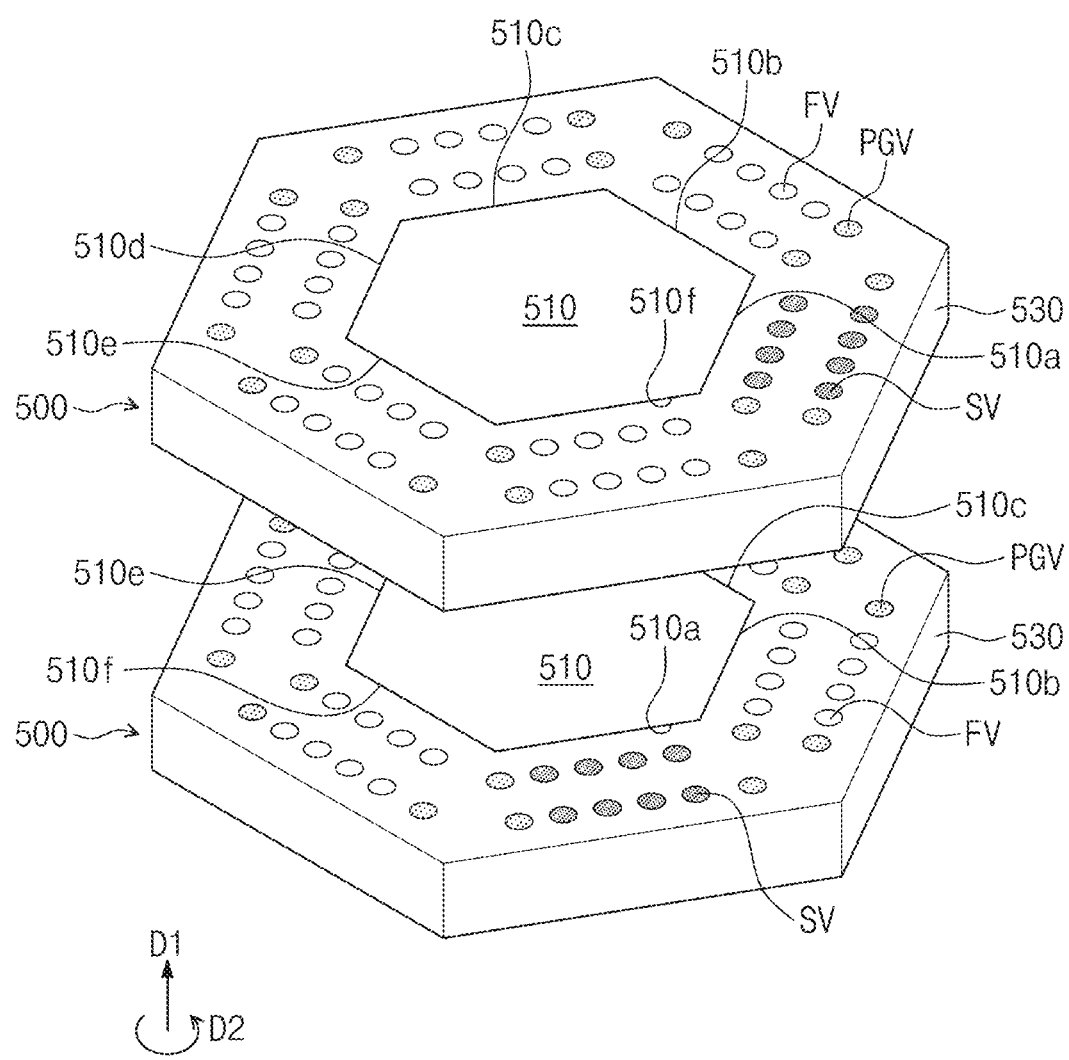
FIG. 10 is a schematic exploded perspective view illustrating configurations of semiconductor packages.

FIG. 8 is a cross-sectional view illustrating a semiconductor device according to an example embodiment of the inventive concepts. FIG. 9 is a schematic plan view illustrating arrangement of through-electrodes of semiconductor packages. FIG. 10 is a schematic exploded perspective view illustrating configurations of semiconductor packages.

Referring to FIGS. 8 to 10, a semiconductor device 30 may include a package stack PS.

The package stack PS may include third semiconductor packages 500 stacked in the first direction D1. The third semiconductor packages 500 may be sequentially stacked. For example, six third semiconductor packages 500 may be sequentially stacked. The third semiconductor packages 500 may have the same or substantially similar components and shape.

The third semiconductor package 500 may include a third redistribution substrate 520, a third semiconductor chip 510, a third molding layer 530, and through-electrodes SV, FV and PGV.

The third redistribution substrate 520 may include a plurality of redistribution patterns. The redistribution patterns may include a fifth redistribution pattern 522, a sixth redistribution pattern 524, and a third insulating pattern 526. The fifth redistribution pattern 522 and the sixth redistribution pattern 524 may be buried in the third insulating pattern 526. The fifth redistribution pattern 522 and the sixth redistribution pattern 524 may be electrically insulated from each other. Here, the fifth redistribution pattern 522 may include a signal transmission pattern connected to the third semiconductor chip 510, and the sixth redistribution pattern 524 may include a floating pattern electrically isolated from the third semiconductor chip 510. A portion of the fifth redistribution pattern 522 and a portion of the sixth redistribution pattern 524 may be exposed through a bottom surface of the third insulating pattern 526, and third connection terminals 502 may be provided on the exposed portions of the fifth and sixth redistribution patterns 522 and 524.

The third semiconductor chip 510 may be mounted on the third redistribution substrate 520. The third semiconductor chip 510 may include a semiconductor substrate, integrated circuits on the semiconductor substrate, interconnection lines connected to the integrated circuits, and third chip pads 512 connected to the interconnection lines. The third chip pads 512 may be electrically connected to the integrated circuits of the third semiconductor chip 510 through the interconnection lines. The third semiconductor chip 510 may have a regular hexagon shape when viewed in a plan view. The third semiconductor chip 510 may include first to sixth sidewalls 510a, 510b, 510c, 510d, 510e and 510f.

The third semiconductor chip 510 may be disposed on the third redistribution substrate 520 in such a way that the third chip pads 512 of the third semiconductor chip 510 face the third redistribution substrate 520. The third chip pads 512 may be connected to the fifth redistribution pattern 522 of the third redistribution substrate 520. The third chip pads 512 may not be connected to the sixth redistribution pattern 524.

The third molding layer 530 may be provided on the third redistribution substrate 520. The third molding layer 530 may cover the third redistribution substrate 520. The third molding layer 530 may cover the third semiconductor chip 510.

The through-electrodes SV, FV and PGV may be provided in the third molding layer 530 on the third redistribution substrate 520. The through-electrodes SV, FV and PGV may be laterally spaced apart from the third semiconductor chip 510. Each of the through-electrodes SV, FV and PGV may be connected to one of the fifth redistribution pattern 522 and the sixth redistribution pattern 524 of the third redistribution substrate 520. Each of the through-electrodes SV, FV and PGV may be electrically connected to the third connection terminal 502 or the third semiconductor chip 510 through one of the fifth and sixth redistribution patterns 522 and 524.

The through-electrodes SV, FV and PGV may include first through-electrodes SV, second through-electrodes FV, and third through-electrodes PGV. The first through-electrodes SV may be signal through-electrodes. The second through-electrodes FV may be floating through-electrodes. The third through-electrodes PGV may be power/ground through-electrodes.

The first through-electrodes SV may be provided on the first sidewall 510a of the third semiconductor chip 510. The first through-electrodes SV may be connected to the fifth redistribution pattern 522 and may be connected to the third semiconductor chip 510 through the fifth redistribution pattern 522.

The second through-electrodes FV may be provided on the second to sixth sidewalls 510b, 510c, 510d, 510e and 510f of the third semiconductor chip 510. The second through-electrodes FV may be connected to the sixth redistribution pattern 524 and may be electrically insulated from the third semiconductor chip 510.

The third through-electrodes PGV may be spaced apart from the first and second through-electrodes SV and FV. For example, the third through-electrodes PGV may be disposed adjacent to a corner of the third semiconductor chip 510. The third through-electrodes PGV may be connected to the third semiconductor chip 510 through a redistribution pattern of the third redistribution substrate 520.

The third semiconductor packages 500 may be stacked. The third semiconductor packages 500 may not be aligned with each other. For example, the third semiconductor packages 500 may be twist-shifted from each other. An upper one of the third semiconductor packages 500 vertically adjacent to each other may be twist-shifted in the second direction D2 with respect to a lower one of the third semiconductor packages 500 vertically adjacent to each other. For example, the third semiconductor packages 500 may overlap with each other in the first direction D1, and the upper one of the third semiconductor packages 500 vertically adjacent to each other may be twist-shifted 60 degrees with respect to the lower one of the third semiconductor packages 500 vertically adjacent to each other. Thus, the first through-electrodes SV of the upper one of the third semiconductor packages 500 may be aligned with the second through-electrodes FV of the lower one of the third semiconductor packages 500. In particular, the first through-electrodes SV of the upper one of the third semiconductor packages 500 may be aligned with the second through-electrodes FV located on the second sidewall 510b of the third semiconductor chip 510 of the lower one of the third semiconductor packages 500.

The third connection terminals 502 of the upper one of the third semiconductor packages 500 may be connected to the through-electrodes SV, FV and PGV of the lower one of the third semiconductor packages 500. The third semiconductor chip 510 of the upper one of the third semiconductor packages 500 may be connected to the second through-electrodes FV of the lower one of the third semiconductor packages 500. The third semiconductor chips 510 of the third semiconductor packages 500 may be respectively connected to the redistribution patterns electrically insulated from each other, and thus a bandwidth of the semiconductor device 30 may be increased.

Figure 11:
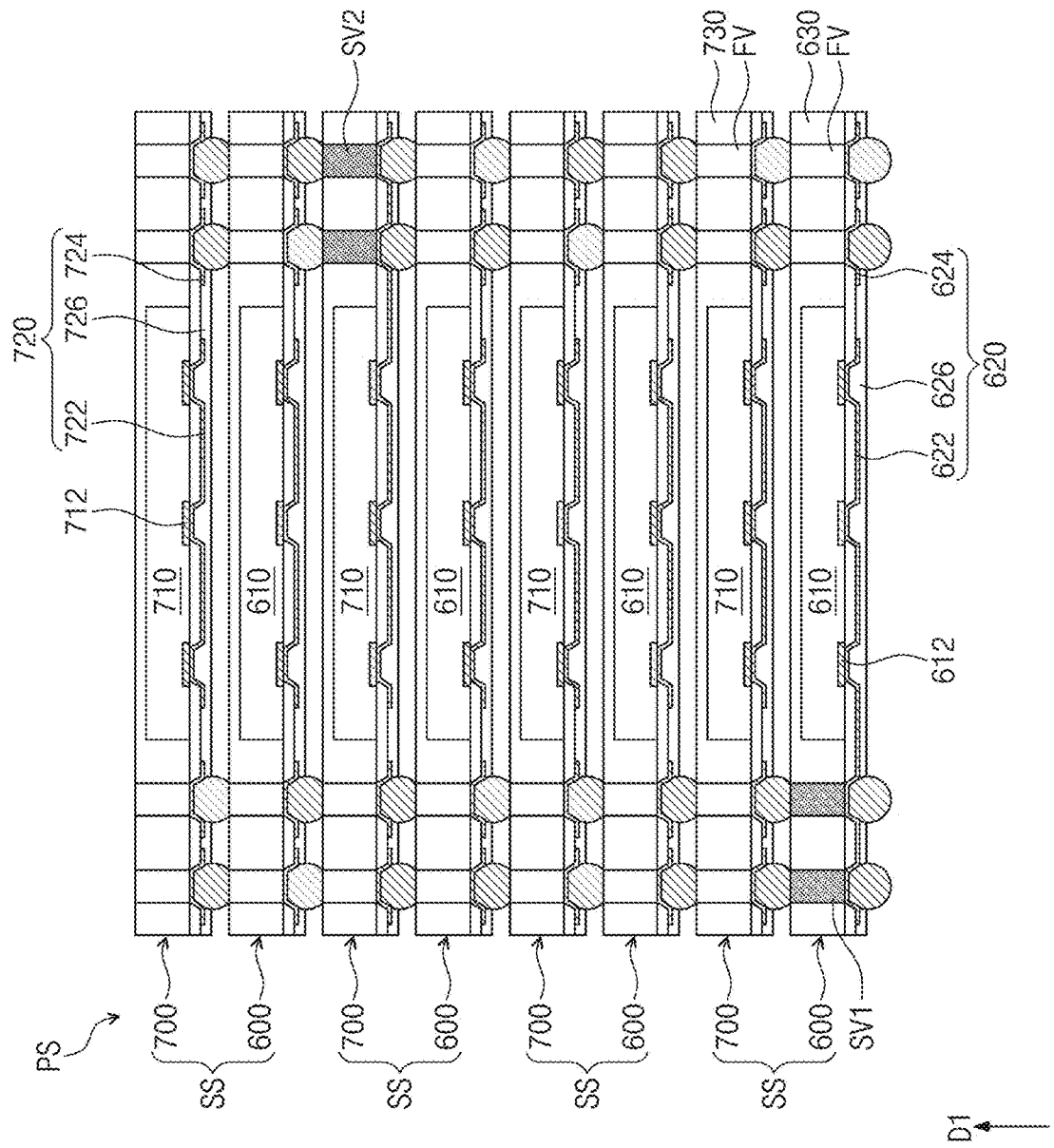
FIG. 11 is a cross-sectional view illustrating a semiconductor device according to an example embodiment of the inventive concepts.
Figure 12:
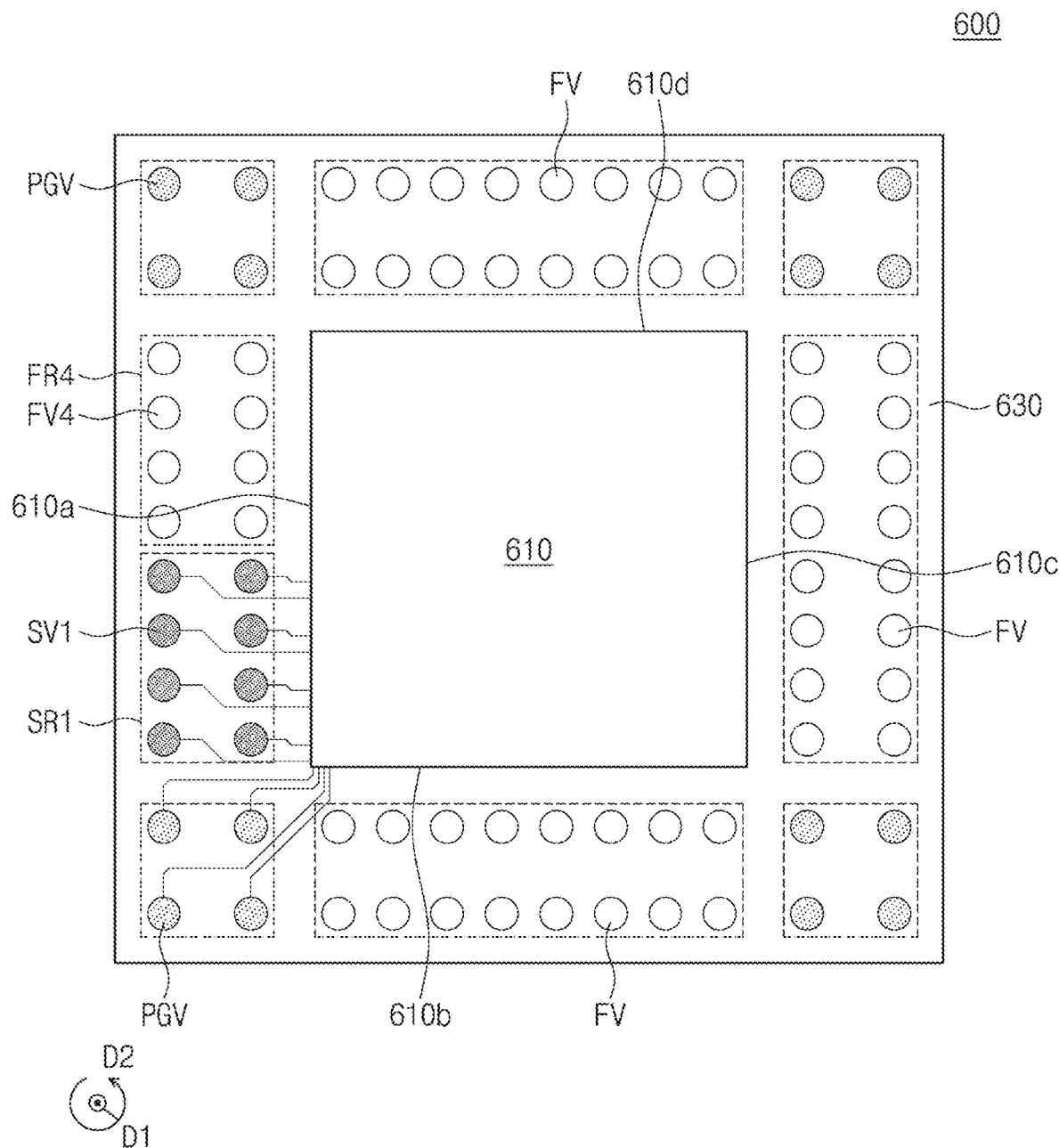
FIGS. 12 and 13 are schematic plan views illustrating arrangements of through-electrodes of semiconductor packages.
Figure 13:
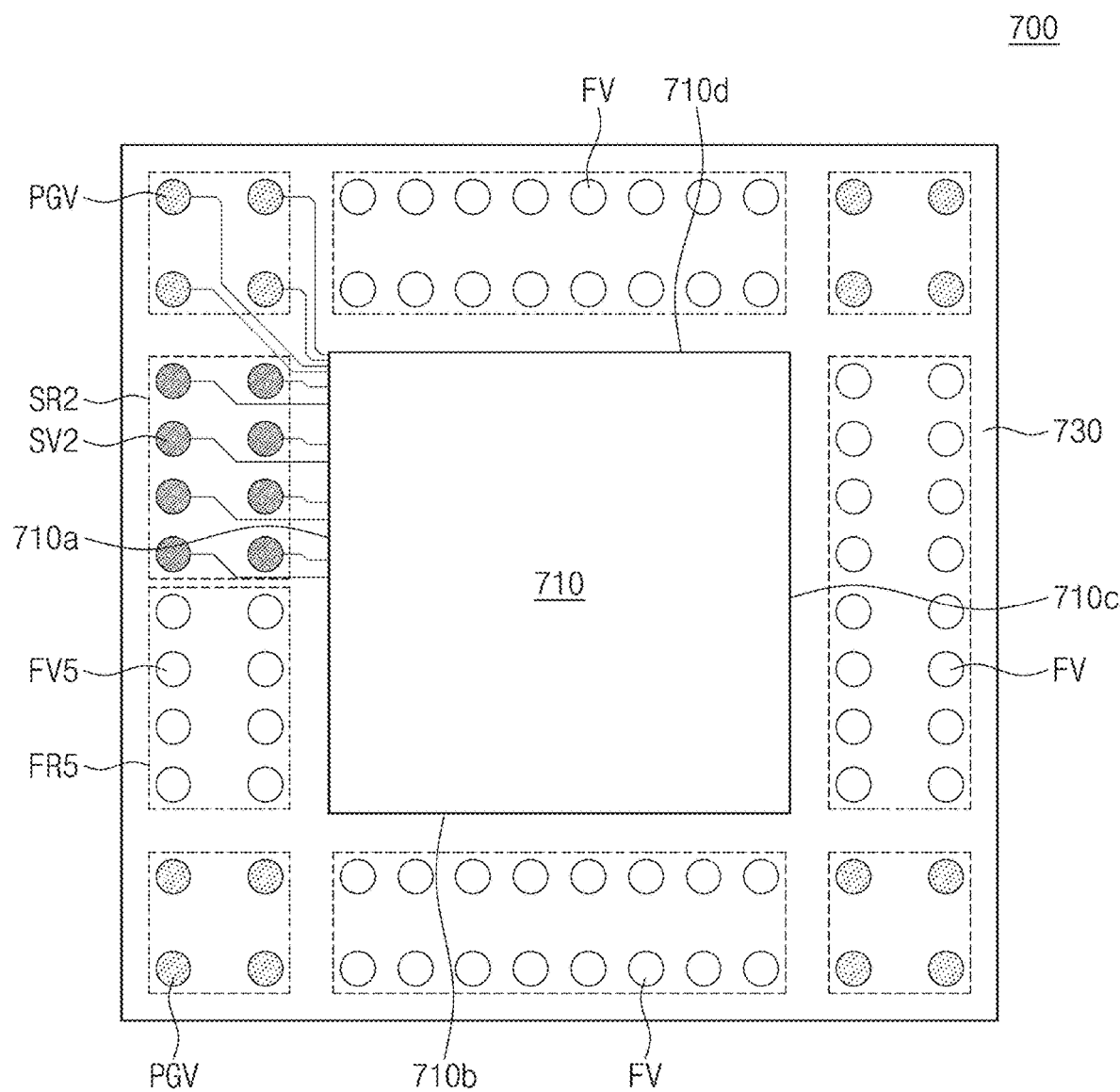
Figure 14:
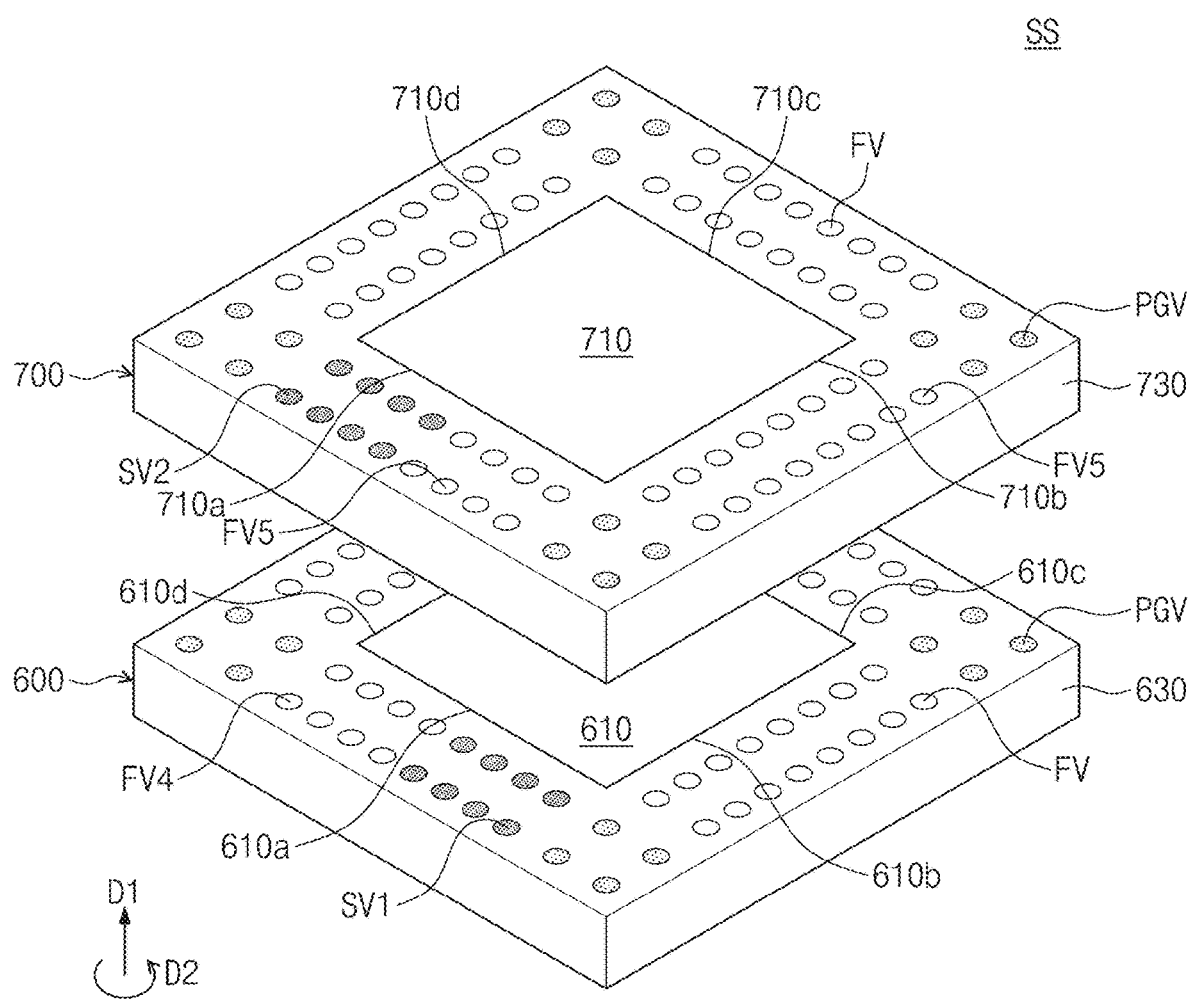
FIG. 14 is a schematic exploded perspective view illustrating configurations of semiconductor packages.

FIG. 11 is a cross-sectional view illustrating a semiconductor device according to an example embodiment of the inventive concepts. FIGS. 12 and 13 are schematic plan views illustrating arrangements of through-electrodes of semiconductor packages. FIG. 14 is a schematic exploded perspective view illustrating configurations of semiconductor packages.

Referring to FIGS. 11 to 13, a semiconductor device may include a package stack PS.

The package stack PS may include fourth semiconductor packages 600 and fifth semiconductor packages 700, which are stacked in the first direction D1. The fourth semiconductor packages 600 and the fifth semiconductor packages 700 may be alternately stacked. For example, the fourth semiconductor package 600 and the fifth semiconductor package 700 which are sequentially stacked may constitute a sub-stack SS, and the package stack PS may include four sub-stacks SS sequentially stacked. The fourth semiconductor packages 600 may have the same or substantially similar components and shape. The fifth semiconductor packages 700 may have the same or substantially similar components and shape. Hereinafter, components of the sub-stack SS will be described in detail.

The fourth semiconductor package 600 may include a fourth redistribution substrate 620, a fourth semiconductor chip 610, a fourth molding layer 630, and through-electrodes SV1, FV and PGV.

The fourth redistribution substrate 620 may include a plurality of redistribution patterns. The redistribution patterns may include a seventh redistribution pattern 622, an eighth redistribution pattern 624, and a fourth insulating pattern 626. The seventh and eighth redistribution patterns 622 and 624 may be electrically insulated from each other.

The fourth semiconductor chip 610 may be mounted on the fourth redistribution substrate 620. The fourth semiconductor chip 610 may be connected to the fourth redistribution substrate 620 through fourth chip pads 612 electrically connected to integrated circuits of the fourth semiconductor chip 610. The fourth chip pads 612 may be connected to the seventh redistribution pattern 622 of the fourth redistribution substrate 620. The fourth chip pads 612 may not be connected to the eighth redistribution pattern 624. The fourth semiconductor chip 610 may have a square shape when viewed in a plan view. The fourth semiconductor chip 610 may include first to fourth sidewalls 610a, 610b, 610c and 610d.

The fourth molding layer 630 may cover the fourth semiconductor chip 610 on the fourth redistribution substrate 620.

First through-electrodes SV1, second through-electrodes FV and third through-electrodes PGV of the fourth semiconductor package 600 may be provided in the fourth molding layer 630. The first through-electrodes SV1 may be signal through-electrodes. The second through-electrodes FV may be floating through-electrodes. The third through-electrodes PGV may be power/ground through-electrodes.

The first through-electrodes SV1 may be provided in a signal region SR1 located on the first sidewall 610a of the fourth semiconductor chip 610. The first through-electrodes SV1 may be connected to the fourth semiconductor chip 610 through the seventh redistribution pattern 622.

The second through-electrodes FV may be provided on the second sidewall 610b, the third sidewall 610c and the fourth sidewall 610d of the fourth semiconductor chip 610. In addition, some FV4 of the second through-electrodes FV may be provided in a fourth floating region FR4 provided on the first sidewall 610a of the fourth semiconductor chip 610. Here, the fourth floating region FR4 may be spaced apart from the signal region SR1 on the first sidewall 610a of the fourth semiconductor chip 610. The second through-electrodes FV may be connected to the eighth redistribution pattern 624 and may be electrically insulated from the fourth semiconductor chip 610.

The third through-electrodes PGV may be spaced apart from the first and second through-electrodes SV1 and FV. For example, the third through-electrodes PGV may be disposed adjacent to a corner of the fourth semiconductor chip 610.

The fifth semiconductor package 700 may include a fifth redistribution substrate 720, a fifth semiconductor chip 710, a fifth molding layer 730, and through-electrodes SV2, FV and PGV.

The fifth redistribution substrate 720 may include a plurality of redistribution patterns. The redistribution patterns may include a ninth redistribution pattern 722, a tenth redistribution pattern 724, and a fifth insulating pattern 726. The ninth and tenth redistribution patterns 722 and 724 may be electrically insulated from each other.

The fifth semiconductor chip 710 may be mounted on the fifth redistribution substrate 720. The fifth semiconductor chip 710 may be connected to the fifth redistribution substrate 720 through fifth chip pads 712 electrically connected to integrated circuits of the fifth semiconductor chip 710. The fifth chip pads 712 may be connected to the ninth redistribution pattern 722 of the fifth redistribution substrate 720. The fifth chip pads 712 may not be connected to the tenth redistribution pattern 724. The fifth semiconductor chip 710 may have a square shape when viewed in a plan view. The fifth semiconductor chip 710 may include first to fourth sidewalls 710a, 710b, 710c and 710d.

The fifth molding layer 730 may cover the fifth semiconductor chip 710 on the fifth redistribution substrate 720.

First through-electrodes SV2, second through-electrodes FV and third through-electrodes PGV of the fifth semiconductor package 700 may be provided in the fifth molding layer 730. The first through-electrodes SV2 may be signal through-electrodes. The second through-electrodes FV may be floating through-electrodes. The third through-electrodes PGV may be power/ground through-electrodes.

The first through-electrodes SV2 may be provided in a signal region SR2 located on the first sidewall 710a of the fifth semiconductor chip 710. The first through-electrodes SV2 may be connected to the fifth semiconductor chip 710 through the ninth redistribution pattern 722.

The second through-electrodes FV may be provided on the second sidewall 710b, the third sidewall 710c and the fourth sidewall 710d of the fifth semiconductor chip 710. In addition, some FV5 of the second through-electrodes FV may be provided in a fifth floating region FR5 provided on the first sidewall 710a of the fifth semiconductor chip 710. Here, the fifth floating region FR5 may be spaced apart from the signal region SR5 on the first sidewall 710a of the fifth semiconductor chip 710. The second through-electrodes FV may be connected to the tenth redistribution pattern 724 and may be electrically insulated from the fifth semiconductor chip 710.

The third through-electrodes PGV may be spaced apart from the first and second through-electrodes SV2 and FV. For example, the third through-electrodes PGV may be disposed adjacent to a corner of the fifth semiconductor chip 710.

The fifth semiconductor package 700 may be mounted on the fourth semiconductor package 600. The fourth semiconductor package 600 and the fifth semiconductor package 700 may have the same planar shape and may be aligned with each other in the first direction D1. For example, the first sidewall 610a of the fourth semiconductor chip 610 may be located in the same plane (e.g., the same vertical plane or a plane in the first direction D1) as the first sidewall 710a of the fifth semiconductor chip 710. Here, the signal region SR5 and the fifth floating region FR5 of the fifth semiconductor package 700 may overlap with the fourth floating region FR4 and the signal region SR4 of the fourth semiconductor package 600, respectively. Thus, the first through-electrodes SV2 of the fifth semiconductor package 700 may be aligned with the some FV4 of the second through-electrodes FV of the fourth semiconductor package 600 in the first direction D1, and the some FV5 of the second through-electrodes FV of the fifth semiconductor package 700 may be aligned with the first through-electrodes SV1 of the fourth semiconductor package 600 in the first direction D1.

The fourth semiconductor chip 610 of the fourth semiconductor package 600 may be connected to the seventh redistribution pattern 622, and the fifth semiconductor chip 710 of the fifth semiconductor package 700 may be connected to the eighth redistribution pattern 624 of the fourth semiconductor package 600 through the ninth redistribution pattern 722 of the fifth semiconductor package 700 and the some FV4 of the second through-electrodes FV of the fourth semiconductor package 600. In other words, the fourth semiconductor chip 610 and the fifth semiconductor chip 710 may be respectively connected to the seventh redistribution pattern 622 and the eighth redistribution pattern 624 which are electrically insulated from each other, and thus a bandwidth of the semiconductor device may be increased.

The sub-stacks SS may be stacked. The sub-stacks SS may not be aligned with each other. For example, the sub-stacks SS may be twist-shifted from each other. An upper one of the sub-stacks SS vertically adjacent to each other may be twist-shifted 90 degrees in the second direction D2 with respect to a lower one of the sub-stacks SS vertically adjacent to each other. The first through-electrodes SV1 and SV2 of the upper one of the sub-stacks SS may be aligned with and connected to the second through-electrodes FV of the lower one of the sub-stacks SS. As a result, the sub-stacks SS may be connected to the redistribution patterns electrically insulated from each other, and thus the bandwidth of the semiconductor device may be increased.

FIGS. 15 to 19 are cross-sectional views illustrating a method for manufacturing a semiconductor device according to an example embodiment of the inventive concepts.

Figure 15:
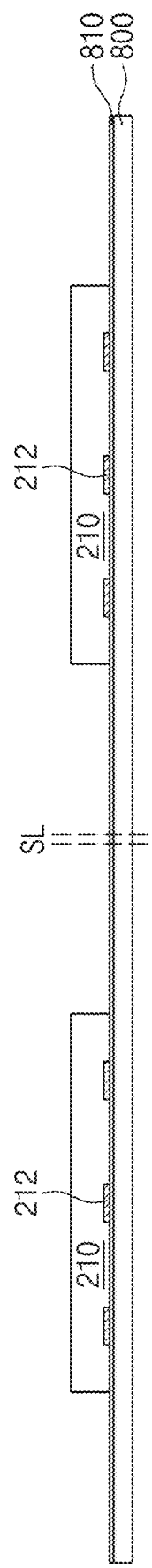
FIGS. 15 to 19 are cross-sectional views illustrating a method for manufacturing a semiconductor device according to an example embodiment of the inventive concepts.

Referring to FIG. 15, a support substrate 800 may be prepared. The support substrate 800 may be a carrier or may be an auxiliary member disposed on the carrier. The support substrate 800 may be formed of at least one of various materials such as glass, plastic, and metal. A separation layer 810 may be conformally formed on the support substrate 800. The separation layer 810 may be a double-sided adhesive tape or an adhesive layer. When the separation layer 810 is the double-sided adhesive tape, the separation layer 810 may be adhered onto the support substrate 800 by a lamination process using a vacuum. When the separation layer 810 is the adhesive layer, the separation layer 810 may be formed by coating the support substrate 800 with an adhesive material.

Semiconductor chips 210 may be disposed on the support substrate 800. The semiconductor chips 210 may be horizontally spaced apart from each other on the separation layer 810. Bottom surfaces of the semiconductor chips 210 may be adhered to the separation layer 810. Chip pads 212 may be disposed on the bottom surface of each of the semiconductor chips 210.

Figure 16:
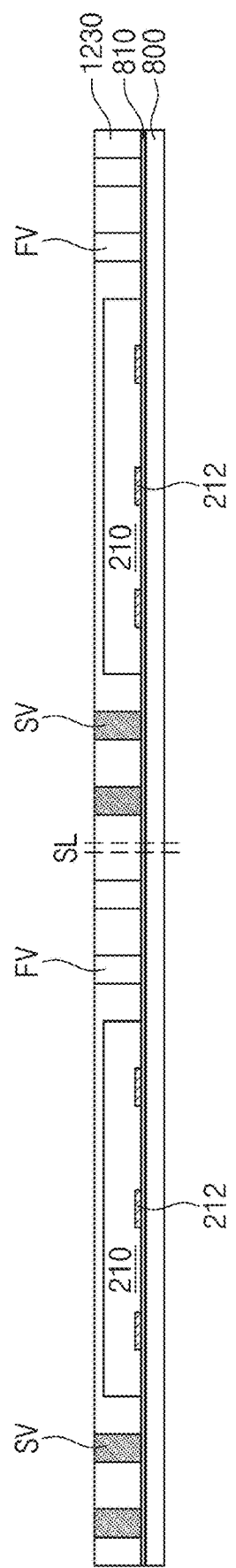

Referring to FIG. 16, a molding layer 1230 may be formed on the support substrate 800. The molding layer 1230 may be formed to cover the semiconductor chips 210 on the support substrate 800. The molding layer 1230 may cover top surfaces and sidewalls of the semiconductor chips 210. The molding layer 1230 may include an insulating polymer (e.g., an epoxy molding compound (EMC)).

First through-electrodes SV and second through-electrodes FV may be formed in the molding layer 1230. For example, holes may be formed to penetrate the molding layer 1230, and then, the first and second through-electrodes SV and FV may be formed by filling the holes with a conductive material. As described with reference to FIG. 2, the first through-electrodes SV may be formed on one sidewall of the semiconductor chip 210, and the second through-electrodes FV may be formed on the other sidewalls of the semiconductor chip 210.

Figure 17:
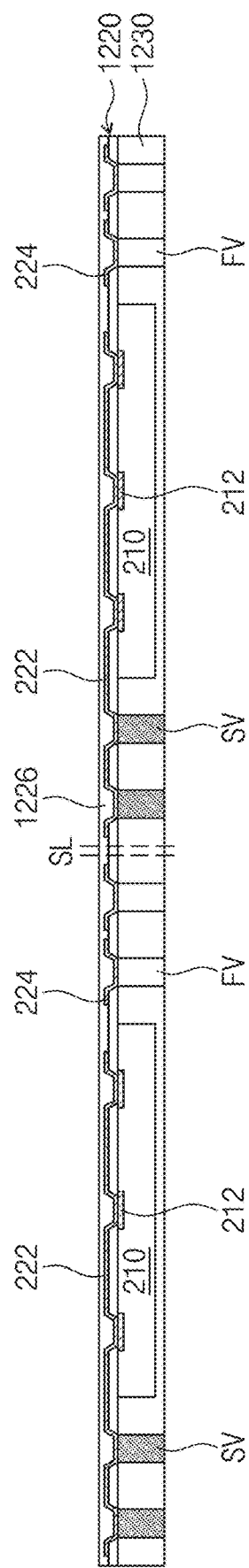

Referring to FIG. 17, the support substrate 800 may be separated from the semiconductor chips 210 by selectively removing the support substrate 800. For example, when the separation layer 810 is the double-sided adhesive tape, the adhesive tape may be weakened by applying heat of 170 degrees Celsius or more, and thus the separation layer 810 may be detached from the semiconductor chips 210. When the support substrate 800 is formed of glass, ultraviolet light may be irradiated to the adhesive tape through a back surface of the support substrate 800, and thus an adhesive of the adhesive tape may be hardened to weaken adhesive strength of the adhesive tape. Alternatively, the separation layer 810 may be melted using chemicals and thus may be removed. Thus, the bottom surfaces of the semiconductor chips 210 and a bottom surface of the molding layer 1230 may be exposed.

A redistribution layer 1220 may be formed on the bottom surface of the molding layer 1230. For example, an insulating layer 1226 may be formed on the bottom surface of the molding layer 1230. For example, the insulating layer 1226 may be formed by a spin-coating method, a physical vapor deposition (PVD) method (e.g., a sputtering method), a chemical vapor deposition (CVD) method, an atomic layer deposition (ALD) method, or a printing method. For example, the insulating layer 1226 may be formed of an inorganic insulating layer (e.g., a silicon oxide layer, a silicon nitride layer, or a silicon oxynitride layer) or an organic polymer insulating layer (e.g., polyimide). In some example embodiments, the insulating layer 1226 may include photosensitive polyimide. Thereafter, the insulating layer 1226 (e.g., a lower portion of the insulating layer 1226) may be patterned to form via holes. The via holes may expose the chip pads 212 of the semiconductor chips 210, the first through-electrodes SV, and the second through-electrodes FV. The via holes may be formed by a laser drilling process, a photolithography process, or an etching process. Redistribution patterns 222 and 224 may be formed on the insulating layer 1226. For example, a conductive layer may be formed on the insulating layer 1226, and the conductive layer may be patterned to form the redistribution patterns 222 and 224. The redistribution patterns 222 and 224 may include a conductive material (e.g., copper (Cu)). The redistribution patterns 222 and 224 may include a first redistribution pattern 222 connected to the chip pads 212 and the first through-electrodes SV, and a second redistribution pattern 224 connected to the second through-electrodes FV. An insulating layer 1226 (e.g., an upper portion of the insulating layer 1226) covering the redistribution patterns 222 and 224 may be formed by depositing an insulating material on the insulating layer 1226 (e.g., the lower portion of the insulating layer 1226).

Figure 18:
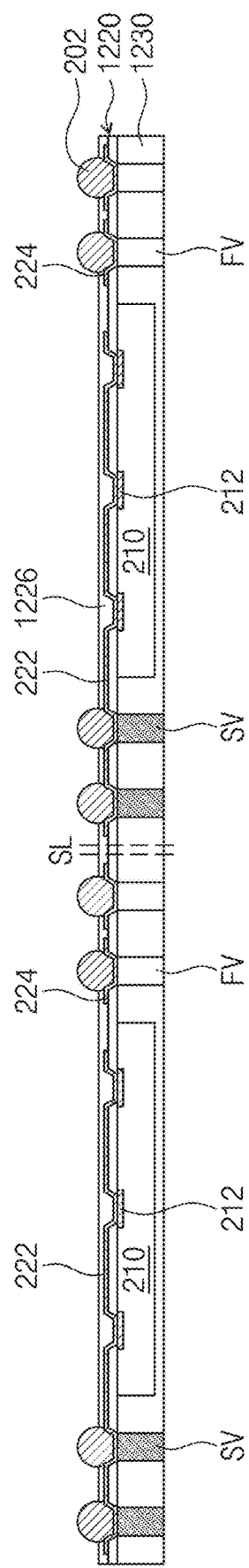

Referring to FIG. 18, the insulating layer 1226 may be etched to form recesses exposing portions of the redistribution patterns 222 and 224, and connection terminals 202 may be formed on the portions of the redistribution patterns 222 and 224, which are exposed by the recesses. For example, the recesses may be formed by a laser drilling process, a photolithography process, or an etching process. The recesses may be formed over the first through-electrodes SV and the second through-electrodes FV to overlap with the first through-electrodes SV and the second through-electrodes FV. Thus, the connection terminals 202 may be formed over the first through-electrodes SV and the second through-electrodes FV to overlap with the first through-electrodes SV and the second through-electrodes FV.

Next, the molding layer 1230 may be cut to separate semiconductor packages 200 from each other. For example, a singulation process may be performed on the molding layer 1230 and the insulating layer 1226 along a sawing line SL of FIG. 18. In other words, since the molding layer 1230 and the insulating layer 1226 are sawed, the semiconductor chips 210 may be separated from each other to manufacture the semiconductor packages 200.

Referring again to FIG. 1, the semiconductor packages 200 may be stacked to form a package stack PS. For example, one of the semiconductor packages 200 may be located at a predetermined position, and then, other semiconductor packages 200 may be stacked on the one semiconductor package 200 to connect the connection terminals 202 to the through-electrodes SV and FV of the one semiconductor package 200. At this time, the semiconductor packages 200 may not be aligned with each other, as described with reference to FIG. 3. For example, the semiconductor packages 200 may be twist-shifted from each other. An upper one of the semiconductor packages 200 vertically adjacent to each other may be twist-shifted 90 degrees with respect to a lower one of the semiconductor packages 200 vertically adjacent to each other. The first through-electrodes SV of the upper one of the semiconductor packages 200 vertically adjacent to each other may be aligned with and connected to the second through-electrodes FV of the lower one of the semiconductor packages 200 vertically adjacent to each other. The semiconductor device 10 described with reference to FIG. 1 may be manufactured as described above.

According to the embodiments of the inventive concepts, the same semiconductor packages 200 may be stacked to manufacture the semiconductor device having a wide bandwidth, and the processes of manufacturing the semiconductor device may be simplified.

In certain example embodiments, the package stack PS may be stacked on a package substrate 100.

The singulation process may be performed on the resultant structure obtained by the processes described with reference to FIGS. 15 to 18. In other words, since the molding layer 1230 and the insulating layer 1226 are sawed, the semiconductor chips 210 may be separated from each other to manufacture the semiconductor packages 200.

Figure 19:
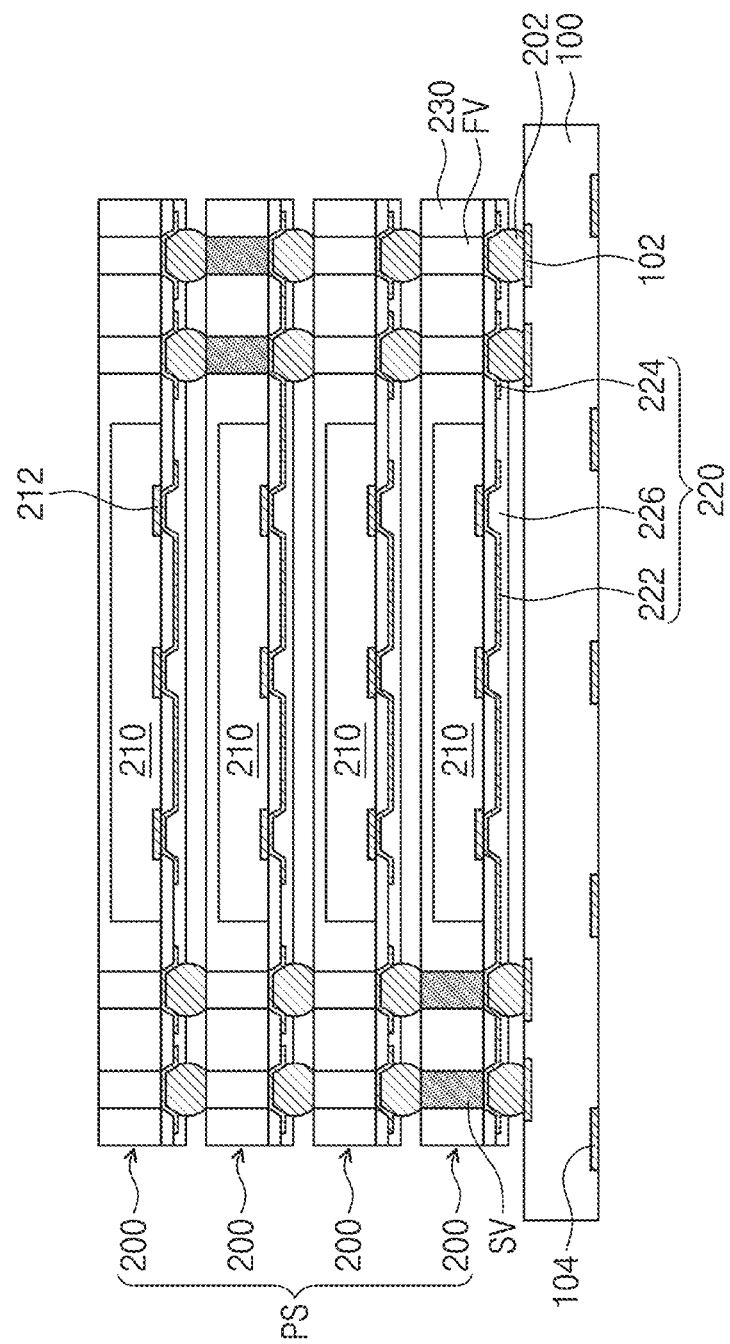

Referring to FIG. 19, the package substrate 100 may be provided. The package substrate 100 may be a printed circuit board (PCB). The package substrate 100 may have a top surface and a bottom surface. First pads 102 may be provided on the top surface of the package substrate 100, and second pads 104 may be provided on the bottom surface of the package substrate 100.

Referring again to FIG. 4, the semiconductor packages 200 may be stacked on the package substrate 100 to form the package stack PS. For example, one of the semiconductor packages 200 may be mounted on the package substrate 100 in such a way that the connection terminals 202 of the one semiconductor package 200 are connected to the first pads 102 of the package substrate 100, and then, other semiconductor packages 200 may be stacked on the one semiconductor package 200 in such a way that the connection terminals 202 of the other semiconductor package 200 are connected to the through-electrodes SV and FV of the one semiconductor package 200.

A package molding layer 300 may be formed on the package substrate 100. For example, a molding member may be deposited to cover the package stack PS on the package substrate 100, and then, the molding member may be hardened to form the package molding layer 300.

Thereafter, external terminals 106 may be provided on the bottom surface of the package substrate 100. The external terminals 106 may be formed on the second pads 104 of the package substrate 100. The semiconductor device 10' described with reference to FIG. 4 may be manufactured as described above.

In the semiconductor device according to the embodiments of the inventive concepts, the semiconductor chips of the semiconductor packages may be respectively connected to the redistribution patterns electrically insulated from each other. Thus, the bandwidth of the semiconductor device may be increased.

According to the embodiments of the inventive concepts, the same semiconductor packages may be stacked to manufacture the semiconductor device having a wide bandwidth, and the processes of manufacturing the semiconductor device may be simplified.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A semiconductor device comprising:
  a first package; and
  a second package stacked on the first package,
  wherein each of the first and second packages comprises,
    a first redistribution substrate having a first redistribution pattern and a second redistribution pattern that are electrically insulated from each other,
    a first semiconductor chip on the first redistribution substrate, the first semiconductor chip electrically connected to the first redistribution pattern and not electrically connected to the second redistribution pattern,
    a first molding layer covering the first semiconductor chip on the first redistribution substrate,
    a first through-electrode penetrating the first molding layer and electrically connected to the first semiconductor chip via the first redistribution pattern, and
    a second through-electrode penetrating the first molding layer, the second through-electrode connected to the second redistribution pattern and not connected to the first redistribution pattern, and
  wherein the first redistribution pattern of the second package is electrically connected to the second through-electrode of the first package.

2. The semiconductor device of claim 1, wherein the first through-electrode of the second package is vertically aligned with the second through-electrode of the first package.

3. The semiconductor device of claim 1, wherein
  the first through-electrode is on a first sidewall of the first semiconductor chip, the first sidewall extending in a first direction,
  the second through-electrode is on a second sidewall of the first semiconductor chip, the second sidewall extending in a second direction, and
  the first direction and the second direction are parallel to a top surface of the first redistribution substrate and intersect each other.

4. The semiconductor device of claim 3, wherein the first sidewall and the second sidewall of the first semiconductor chip meet each other.

5. The semiconductor device of claim 3, wherein the first sidewall of the first semiconductor chip of the second package is in a same vertical plane as the second sidewall of the first semiconductor chip of the first package.

6. The semiconductor device of claim 3, wherein the first semiconductor chip has a square shape when viewed in a plan view.

7. The semiconductor device of claim 6, wherein
  the first package and the second package have a same planar shape, and the second package is twist-shifted 90 degrees with respect to the first package when viewed in a plan view.

8. The semiconductor device of claim 1, wherein the first semiconductor chip of the second package is electrically connected to the second redistribution pattern of the first package through the first redistribution pattern of the second package and the second through-electrode of the first package.

9. The semiconductor device of claim 8, further comprising:
a third package stacked on the second package,
wherein the third package comprises,
a second redistribution substrate having a third redistribution pattern,
a second semiconductor chip on the second redistribution substrate and connected to the third redistribution pattern,
a second molding layer covering the second semiconductor chip on the second redistribution substrate, and
a third through-electrode penetrating the second molding layer so as to be connected to the third redistribution pattern, and
wherein the third redistribution pattern of the third package is electrically connected to the second through-electrode of the second package.

10. The semiconductor device of claim 9, wherein the first package further comprises a fourth through-electrode penetrating the first molding layer and not connected to the first and second redistribution patterns,
the first redistribution substrate of the first package further has a fourth redistribution pattern insulated from the first and second redistribution patterns, and
the second semiconductor chip of the third package is electrically connected to the fourth redistribution pattern of the first package through the third redistribution pattern of the third package, the second through-electrode of the second package, and the fourth through-electrode of the first package.

11. The semiconductor device of claim 1, wherein each of the first and second packages further comprises fifth through-electrodes penetrating the first molding layer so as to be connected to a power/ground circuit of the first redistribution substrate, and
the fifth through-electrodes of the second package are connected to the fifth through-electrodes of the first package.

12. The semiconductor device of claim 1, further comprising:
a package substrate on which the first package is stacked; and
a package molding layer covering the first and second packages on the package substrate.

13. A semiconductor device comprising:
semiconductor packages sequentially stacked,
wherein each of the semiconductor packages comprises,
a redistribution substrate having a first redistribution pattern and a second redistribution pattern, the first and second redistribution patterns being insulated from each other,
a semiconductor chip on the redistribution substrate, the semiconductor chip electrically connected to the first redistribution pattern and not electrically connected to the second redistribution pattern,
a first molding layer surrounding the semiconductor chip, and
through-electrodes penetrating the first molding layer, the through-electrodes comprising,
a first through-electrode on a first sidewall of the semiconductor chip and electrically connected to the semiconductor chip via the first redistribution pattern, and
a second through-electrode spaced apart from the first through-electrode, the second through-electrode connected to the second redistribution pattern and not connected to the first redistribution pattern, and
wherein the first through-electrode of one semiconductor package of the semiconductor packages is vertically aligned with the second through-electrode of another semiconductor package of the semiconductor packages thereunder.

14. The semiconductor device of claim 13, wherein the first redistribution pattern of the one semiconductor package is connected to the second through-electrode of the another semiconductor package.

15. The semiconductor device of claim 13, wherein the second through-electrode is located on a second sidewall of the semiconductor chip, the second sidewall being different from the first sidewall.

16. The semiconductor device of claim 15, wherein the first sidewall of the semiconductor chip of the one semiconductor package is in a same vertical plane as the second sidewall of the semiconductor chip of the another semiconductor package.

17. The semiconductor device of claim 15, wherein the first sidewall and the second sidewall meet each other.

18. The semiconductor device of claim 17, wherein the one semiconductor package is twist-shifted with respect to the another semiconductor package when viewed in a plan view.

19. The semiconductor device of claim 17, wherein the semiconductor chip has a polygonal shape including a tetragonal shape or a hexagonal shape when viewed in a plan view.

20. The semiconductor device of claim 13, wherein the semiconductor chip is connected to the first redistribution pattern of the redistribution substrate.

* * * * *